US009673213B1

(12) United States Patent
Yu et al.

(10) Patent No.: US 9,673,213 B1
(45) Date of Patent: Jun. 6, 2017

(54) THREE DIMENSIONAL MEMORY DEVICE WITH PERIPHERAL DEVICES UNDER DUMMY DIELECTRIC LAYER STACK AND METHOD OF MAKING THEREOF

(71) Applicant: SANDISK TECHNOLOGIES INC., Plano, TX (US)

(72) Inventors: Jixin Yu, Milpitas, CA (US); Yanli Zhang, San Jose, CA (US); Zhenyu Lu, Milpitas, CA (US); Johann Alsmeier, San Jose, CA (US); Daxin Mao, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/043,761

(22) Filed: Feb. 15, 2016

(51) Int. Cl.
*H01L 29/76* (2006.01)
*H01L 29/94* (2006.01)
(Continued)

(52) U.S. Cl.
CPC ...... *H01L 27/11582* (2013.01); *H01L 23/535* (2013.01); *H01L 27/11556* (2013.01); *H01L 29/42328* (2013.01); *H01L 29/42344* (2013.01)

(58) Field of Classification Search
CPC ..... H01L 21/823437; H01L 21/823475; H01L 21/823481; H01L 21/265; H01L 21/31; H01L 21/283
(Continued)

(56) References Cited

U.S. PATENT DOCUMENTS 5,915,167 A  6/1999 Leedy
6,881,994 B2  4/2005 Lee et al.
(Continued)

FOREIGN PATENT DOCUMENTS

WO  WO02/15277 A2  2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Theresa T. Doan
(74) *Attorney, Agent, or Firm* — The Marbury Law Group PLLC

(57) ABSTRACT

A method of manufacturing a structure includes forming an in-process alternating stack including insulating layers and spacer material layers over a substrate, forming two sets of stepped surfaces by dividing the in-process alternating stack into a first alternating stack and a second alternating stack, the first alternating stack having first stepped surfaces and the second alternating stack having second stepped surfaces, forming at least one memory stack structure through the first alternating stack, each of the at least one memory stack structure including charge storage regions, a tunneling dielectric, and a semiconductor channel, replacing portions of the insulating layers in the first alternating stack with electrically conductive layers while leaving intact portions of the insulating layers in the second alternating stack, and forming a contact via structure through the second alternating stack to contact a peripheral semiconductor device under the second stack.

23 Claims, 27 Drawing Sheets

(51) Int. Cl.
*H01L 27/11582* (2017.01)
*H01L 27/11556* (2017.01)
*H01L 29/423* (2006.01)
*H01L 23/535* (2006.01)

(58) Field of Classification Search
USPC ........................................................ 257/334
See application file for complete search history.

(56) References Cited

U.S. PATENT DOCUMENTS

| | | |
|---|---|---|
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,696,559 B2 | 4/2010 | Arai et al. |
| 7,745,265 B2 | 6/2010 | Mokhlesi et al. |
| 7,746,680 B2 | 6/2010 | Scheuerlein et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,107,270 B2 | 1/2012 | Scheuerlein et al. |
| 8,187,936 B2 | 5/2012 | Alsmeier et al. |
| 8,349,681 B2 | 1/2013 | Alsmeier et al. |
| 8,394,716 B2 | 3/2013 | Hwang et al. |
| 8,461,000 B2 | 6/2013 | Alsmeier et al. |
| 8,580,639 B2 | 11/2013 | Alsmeier et al. |
| 8,603,906 B2 | 12/2013 | Shim et al. |
| 8,643,142 B2 | 2/2014 | Higashitani et al. |
| 8,765,543 B2 | 7/2014 | Alsmeier et al. |
| 8,901,745 B2 | 12/2014 | Hwang et al. |
| 9,023,719 B2 | 5/2015 | Pachamuthu et al. |
| 9,224,747 B2 | 12/2015 | Mizutani et al. |
| 9,230,905 B2 | 1/2016 | Takaki et al. |
| 9,236,392 B1 | 1/2016 | Izumi et al. |
| 2007/0210338 A1 | 9/2007 | Orlowski |
| 2007/0252201 A1 | 11/2007 | Kito et al. |
| 2009/0230449 A1 | 9/2009 | Sakaguchi et al. |
| 2009/0242967 A1 | 10/2009 | Katsumata et al. |
| 2009/0268523 A1 | 10/2009 | Maejima |
| 2010/0013049 A1 | 1/2010 | Tanaka et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0163968 A1* | 7/2010 | Kim ............... H01L 27/11582 257/324 |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0031546 A1 | 2/2011 | Uenaka et al. |
| 2011/0076819 A1 | 3/2011 | Kim et al. |
| 2011/0133606 A1 | 6/2011 | Yoshida et al. |
| 2011/0169071 A1 | 7/2011 | Uenaka et al. |
| 2011/0266606 A1 | 11/2011 | Park et al. |
| 2011/0284943 A1 | 11/2011 | Hwang et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0012920 A1 | 1/2012 | Shin et al. |
| 2012/0119287 A1 | 5/2012 | Park et al. |
| 2013/0113033 A1 | 5/2013 | Choi et al. |
| 2013/0130468 A1 | 5/2013 | Higashitani et al. |
| 2013/0161821 A1 | 6/2013 | Hwang et al. |
| 2013/0264631 A1 | 10/2013 | Alsmeier et al. |
| 2013/0313627 A1 | 11/2013 | Lee et al. |
| 2014/0061748 A1 | 3/2014 | Lee |
| 2014/0061766 A1 | 3/2014 | Kito et al. |
| 2014/0131787 A1 | 5/2014 | Alsmeier |
| 2014/0175530 A1 | 6/2014 | Chien et al. |
| 2014/0264934 A1 | 9/2014 | Chen et al. |
| 2015/0076584 A1 | 3/2015 | Pachamuthu et al. |
| 2015/0179659 A1 | 6/2015 | Takaki |
| 2015/0179660 A1 | 6/2015 | Yada et al. |
| 2015/0179662 A1* | 6/2015 | Makala ............ H01L 27/11582 257/314 |
| 2016/0064281 A1 | 3/2016 | Izumi et al. |
| 2016/0071876 A1 | 3/2016 | Mizuno et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

International Search Report and Written Opinion, International Application No. PCT/US2015/021767; issued Jun. 24, 2015.

U.S. Appl. No. 14/517,134, filed Oct. 17, 2014, SanDisk Technologies Inc.

U.S. Appl. No. 14/723,868, filed May 28, 2015, SanDisk Technologies Inc.

U.S. Appl. No. 14/739,354, filed Jun. 15, 2015, SanDisk Technologies Inc.

U.S. Appl. No. 14/739,284, filed Jun. 15, 2015, SanDisk Technologies Inc.

U.S. Appl. No. 14/291,415 RI, filed May 30, 2014 SanDisk 3D LLC.

U.S. Appl. No. 14/832,579, filed Aug. 21, 2015, SanDisk Technologies Inc.

U.S. Appl. No. 14/925,224, filed Oct. 28, 2015, SanDisk Technologies Inc.

U.S. Appl. No. 14/995,017, filed Jan. 13, 2016, SanDisk Technologies Inc.

International Search Report and Written Opinion of the International Searching Authority for International Application No. PCT/US2016/067341, mailed Mar. 20, 2017, 15 pages.

* cited by examiner

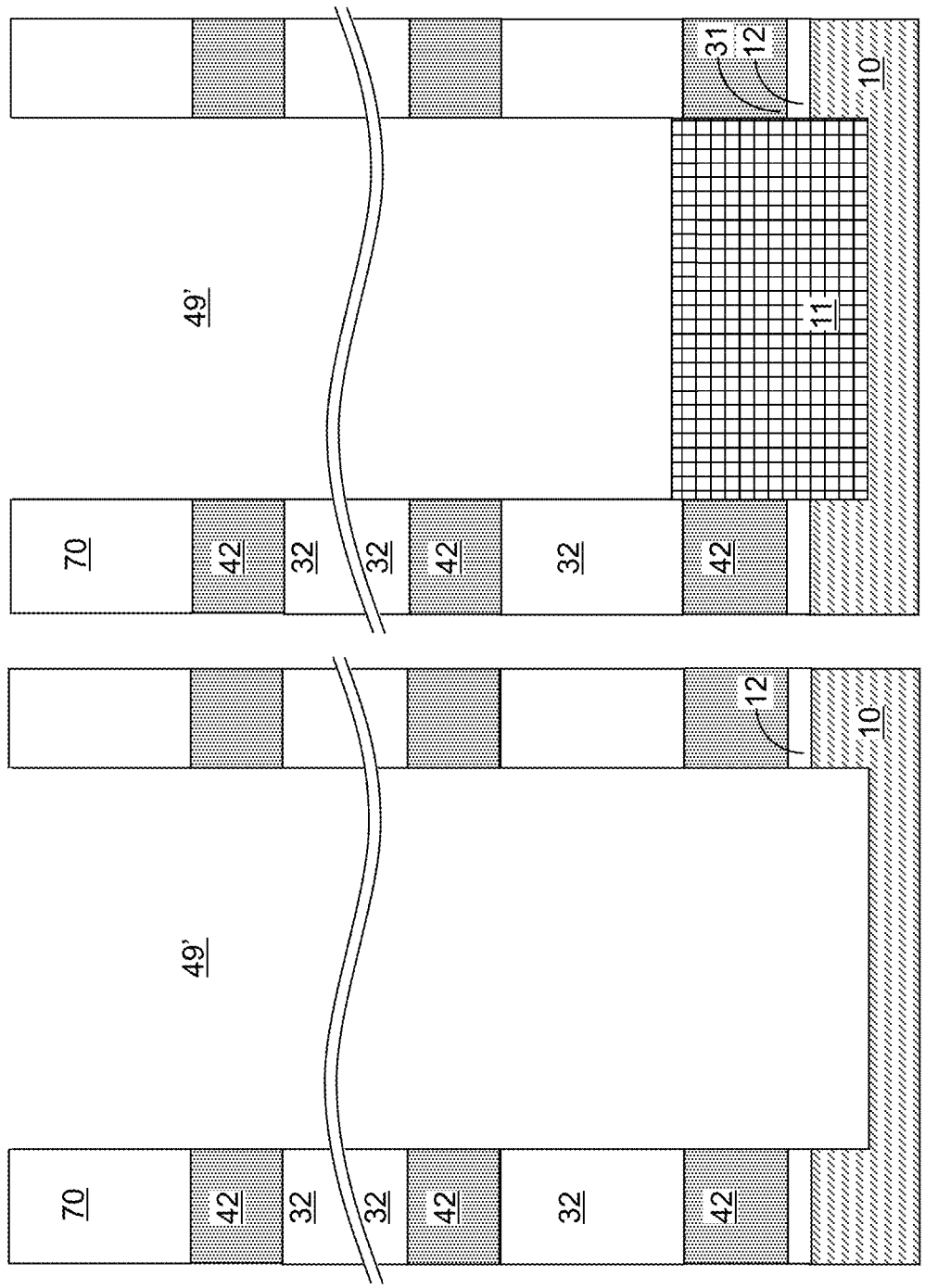

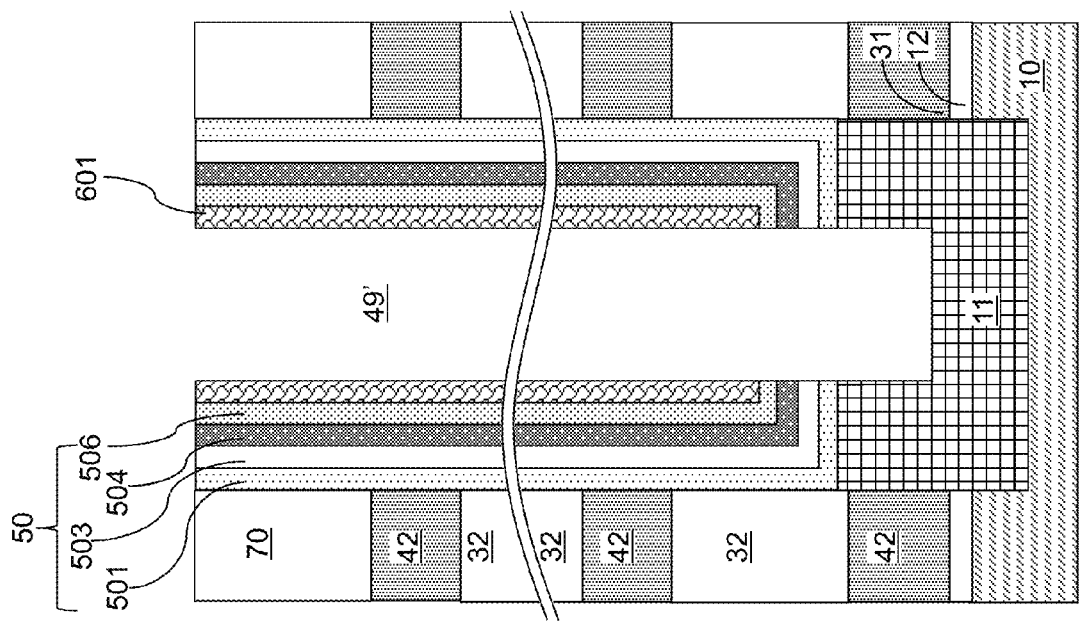
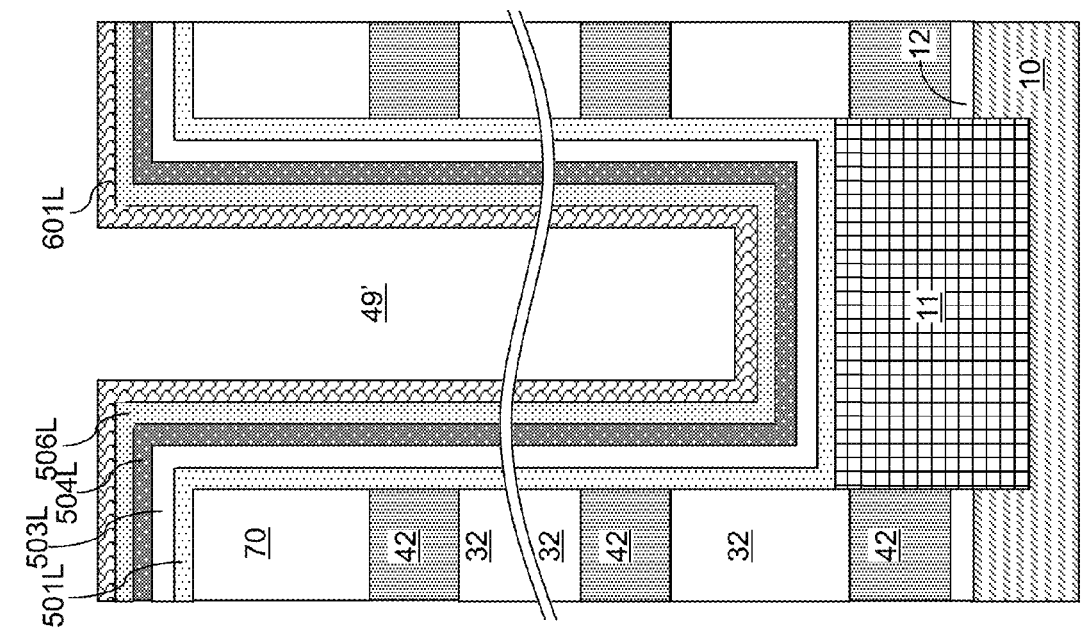

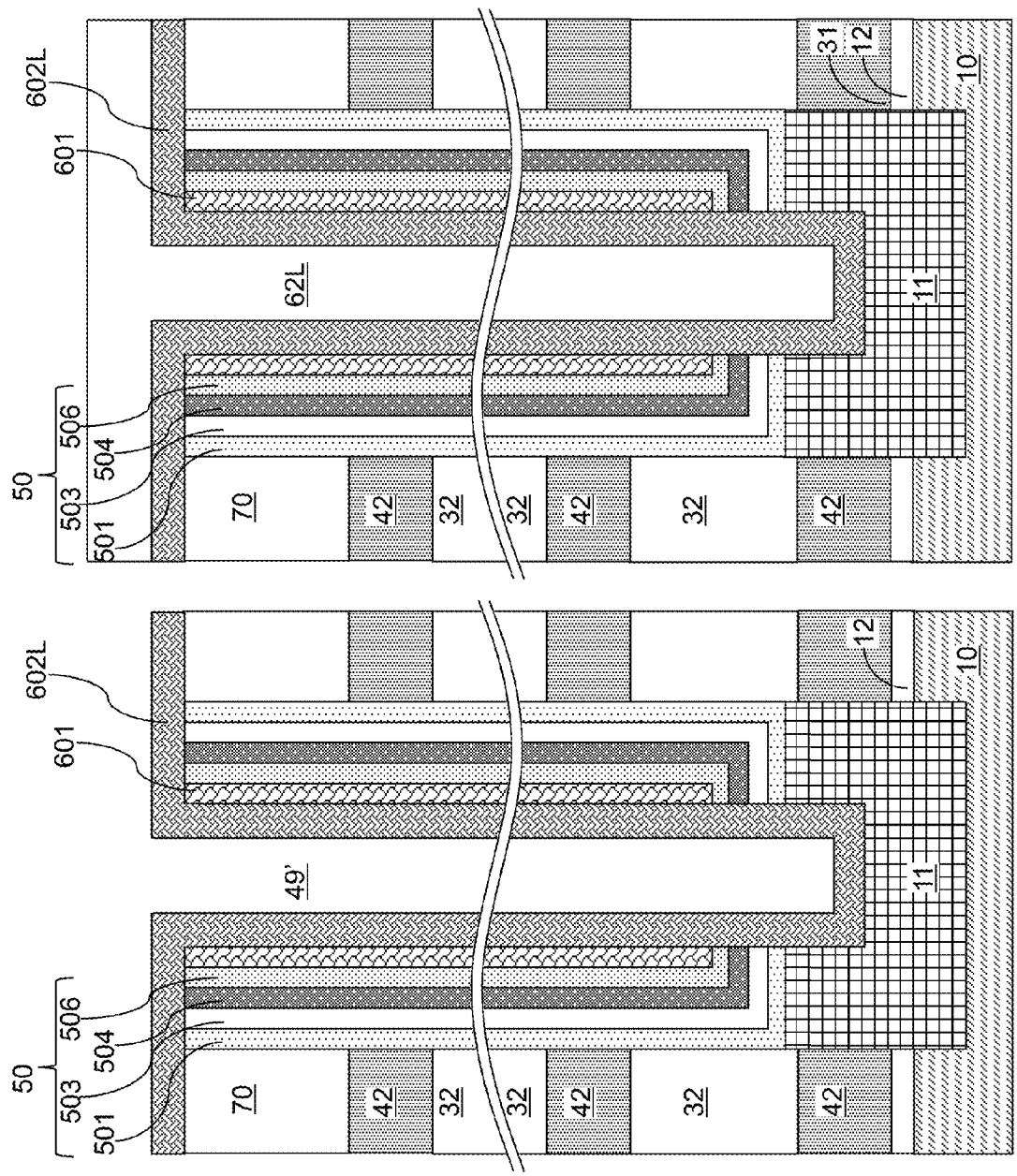

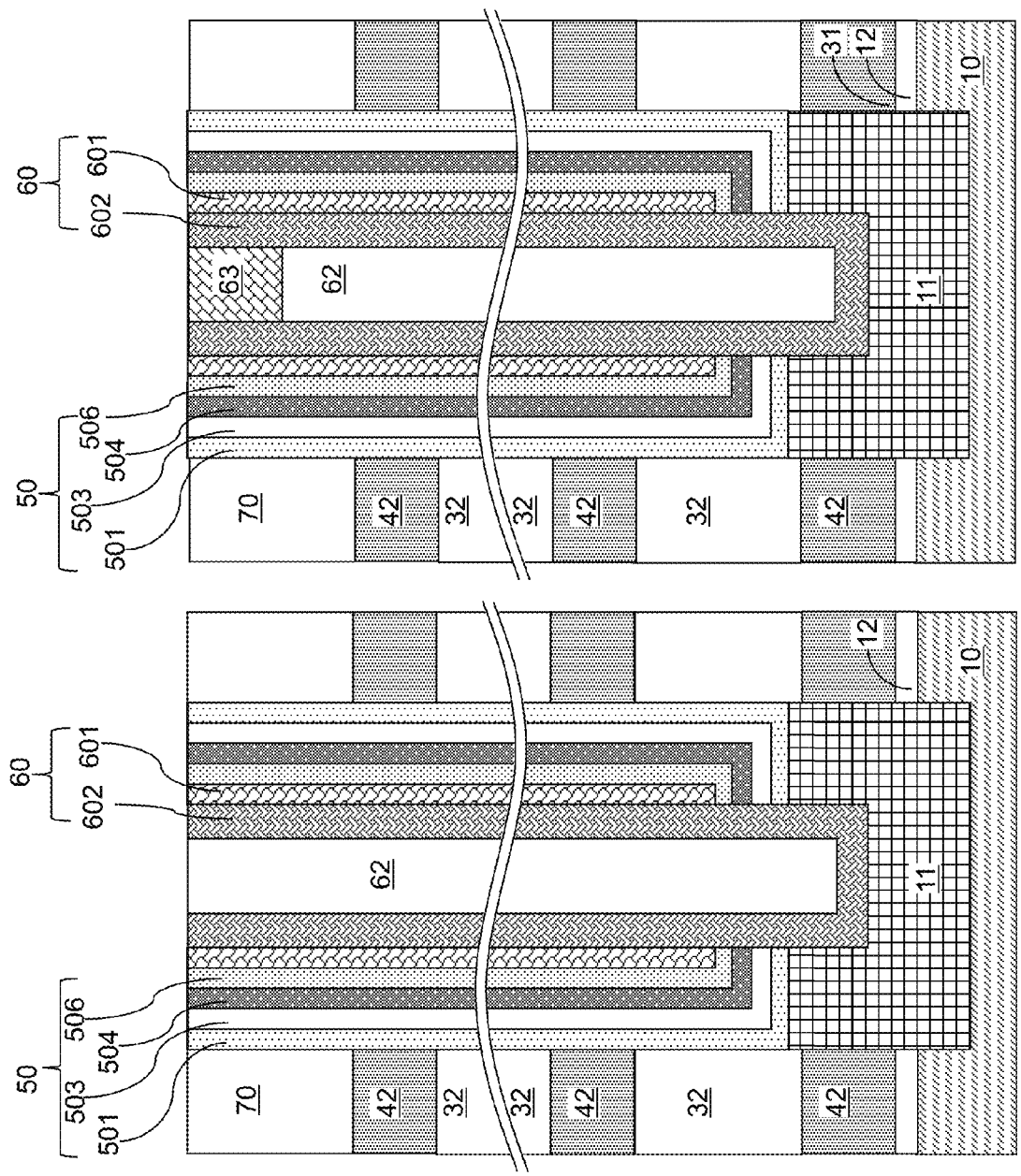

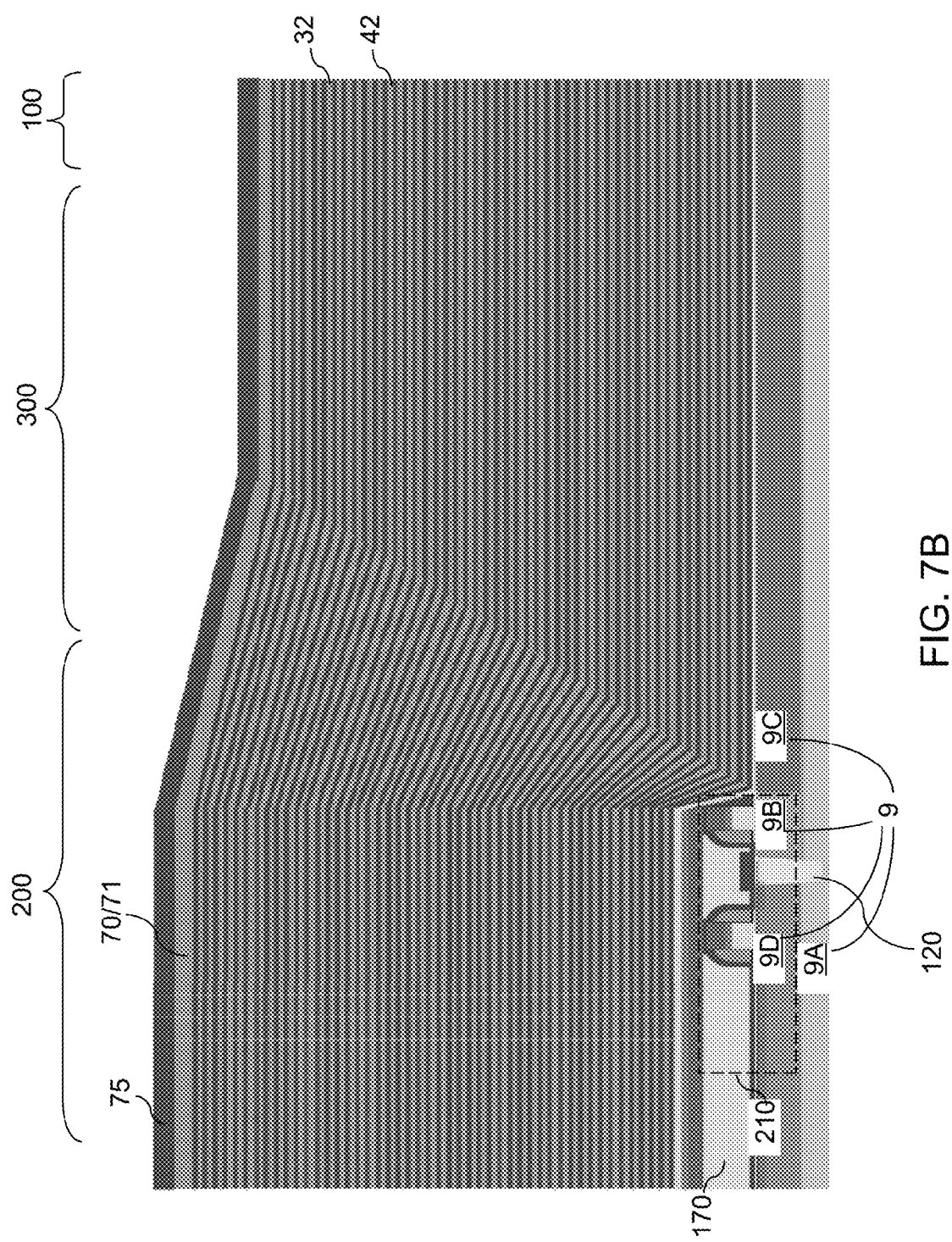

US 9,673,213 B1

THREE DIMENSIONAL MEMORY DEVICE WITH PERIPHERAL DEVICES UNDER DUMMY DIELECTRIC LAYER STACK AND METHOD OF MAKING THEREOF

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et al., titled "Novel Ultra High Density Memory With A Stacked-Surrounding Gate Transistor (S-SGT) Structured Cell", IEDM Proc. (2001) 33-36. A three-dimensional NAND memory structure includes an alternating stack of insulating layers and electrically conductive layers. A high device density is preferred in order to provide cost-effective manufacturing of such three-dimensional NAND memory structures.

SUMMARY

According to an aspect of the present disclosure, a structure is provided, which comprises a first alternating stack of first insulating layers and electrically conductive layers located over a substrate; a second alternating stack of second insulating layers and spacer material layers located over the substrate and laterally spaced from the first alternating stack, wherein the first and second insulating layers comprise a first dielectric material, and the spacer material layers comprise a second dielectric material different than the first dielectric material; at least one memory stack structure vertically extending through the first alternating stack, each of the at least one memory stack structure comprising charge storage regions, a tunneling dielectric, and a semiconductor channel; and a contact via structure vertically extending through the second alternating stack and contacting a device on or in the substrate.

According to another aspect of the present disclosure, a method of manufacturing a structure includes forming an in-process alternating stack including insulating layers and spacer material layers over a substrate, forming two sets of stepped surfaces by dividing the in-process alternating stack into a first alternating stack and a second alternating stack, the first alternating stack having first stepped surfaces and the second alternating stack having second stepped surfaces, forming at least one memory stack structure through the first alternating stack, each of the at least one memory stack structure including charge storage regions, a tunneling dielectric, and a semiconductor channel, replacing portions of the insulating layers in the first alternating stack with electrically conductive layers while leaving intact portions of the insulating layers in the second alternating stack, and forming a contact via structure through the second alternating stack to contact a peripheral semiconductor device under the second stack.

BRIEF DESCRIPTION OF THE DRAWINGS

FIGS. 2A-2H are sequential vertical cross-sectional views of a memory opening within the first exemplary structure during various processing steps employed to form a memory stack structure according to the first embodiment of the present disclosure.

FIG. 7B is a vertical cross-sectional view of an in-process structure of still another embodiment of the present disclosure at the processing step of FIG. 3.

DETAILED DESCRIPTION

Figure 1:
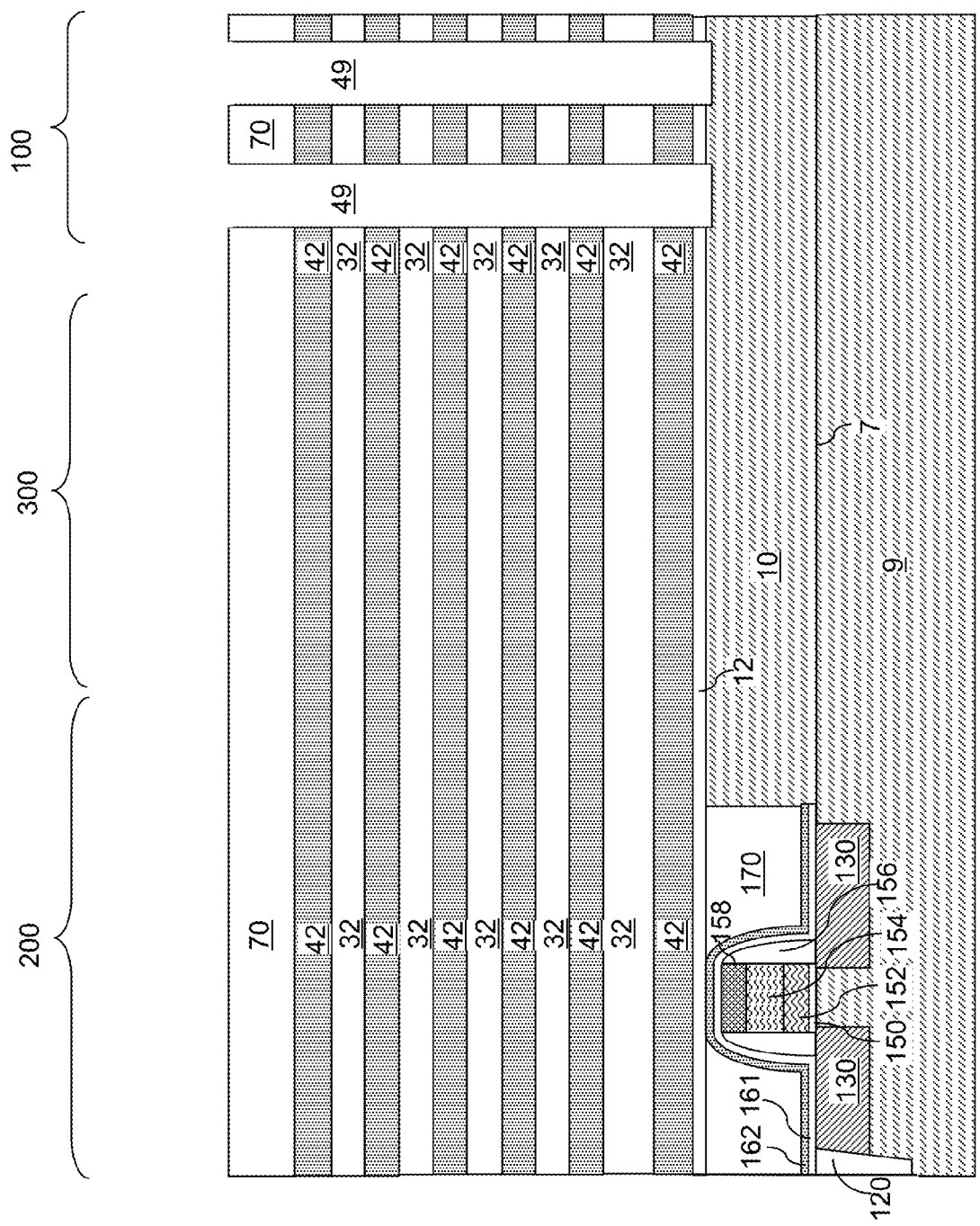
FIG. 1 is a vertical cross-sectional view of a first exemplary structure after formation of an alternating stack of insulating layers and sacrificial material layers and memory openings extending through the alternating stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. Disclosure of an embodiment in which a first element comprises a second element herein also discloses another embodiment in which the first element consists essentially of, or consists of, the second element except for cases in which presence of an additional element is inherently implied.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which may include a semiconductor substrate (e.g., a single crystalline silicon wafer). The substrate can include a substrate semiconductor layer 9 including a top surface 7, which is herein referred to as a major surface of the substrate (as opposed to a minor surface having a lesser area such as a sidewall surface of the substrate semiconductor layer 9). The substrate semiconductor layer 9 may be a semiconductor wafer or semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art. An optional semiconductor well layer 10 may be located over the substrate semiconductor layer 9.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0\times10^{-6}$ S/cm. All measurements for electrical conductivities are made at the standard condition. The semiconductor well layer 10 can include at least one doped well (not expressly shown) having a substantially uniform dopant concentration therein.

The first exemplary structure can have multiple regions for building different types of devices. Such areas can include, for example, a device region 100, a contact region 300, and a peripheral device region 200. At least one semiconductor device for a peripheral circuitry can be formed on, or in, a portion of the substrate semiconductor layer 9. The at least one semiconductor device can include, for example, field effect transistors that are formed in the peripheral device region 200. Optionally, a portion of the substrate semiconductor layer 9 in the peripheral device region may be recessed by a masked recess etch, or may be raised by a selective epitaxy process that employs a dielectric hard mask that covers other regions, prior to formation of the at least one semiconductor device therein.

Optionally, shallow trench isolation structures 120 may be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor well layer 10 can be formed on the top surface of the substrate semiconductor layer 9 by deposition of a single crystalline semiconductor material, for example, by selective epitaxy. Alternatively, the optional semiconductor well layer 10 may be formed by implantation of electrical dopants (p-type dopants or n-type dopants) into at least one upper portion of the substrate semiconductor layer 9. In case the optional semiconductor well layer 10 is not formed, the substrate semiconductor layer 9 can extend to the top surface of the substrate. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor well layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor well layer 10 can have a top surface that is coplanar with the top surface of the planarization dielectric layer 170.

In one embodiment, the semiconductor well layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor well layer 10 or can be a portion of the semiconductor well layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0\times10^{15}/cm^3$ to $1.0\times10^{18}/cm^3$, although lesser and greater dopant concentration levels can also be employed. As used herein, a dopant concentration level refers to average dopant concentration for a given region.

Optionally, a gate dielectric layer 12 can be formed above the semiconductor well layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a spacer material layer, which is a material layer that provides vertical spacing between a neighboring pair of insulating layers 32. In one embodiment, each first material layer can be an insulating layer 32, and each second material layer can be a sacrificial material layer 42. In other words, the spacer material layers may be sacrificial material layers 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein. Alternatively, the spacer material layers may be formed as electrically conductive layers. In this case, replacement of the spacer material layers with different electrically conductive layers in a subsequent processing step may not be necessary.

The stack of the alternating plurality is herein referred to as an alternating stack (32, 42). The alternating stack (32, 42) is an in-process structure, i.e., an in-process alternating stack. As used herein, an "in-process" structure refers to a structure that is modified during a subsequent processing step. In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, silicon oxynitride, and a dielectric metal oxide.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42. In another embodiment, the sacrificial material layers 42 in the alternating stack (32, 42) can have thickness variations.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2H illustrate sequential vertical cross-sectional views of a memory opening during formation of an exemplary memory stack structure. Formation of the exemplary memory stack structure can be performed within each of the memory openings 49 in the first exemplary structure illustrated in FIG. 1.

Referring to FIG. 2A, a memory opening 49 is illustrated. The memory opening 49 extends through the insulating cap layer 70, the alternating stack (32, 42), and the gate dielectric layer 12, and optionally into an upper portion of the semiconductor material layer 10. The recess depth of the bottom surface of each memory opening 49 with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the first exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor material layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor material layer 10. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Referring to FIG. 2C, a series of layers including at least one blocking dielectric layer (501L, 503L), a continuous memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

In an illustrative example, the first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

The continuous memory material layer 504L, the tunneling dielectric layer 506L, and the optional first semiconductor channel layer 601L can be sequentially formed. In one embodiment, the continuous memory material layer 504L can be a charge trapping material including a dielectric charge trapping material, which can be, for example, silicon nitride. Alternatively, the continuous memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504L includes a silicon nitride layer.

The continuous memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504L may comprise an insulating charge trapping material, such as one or more silicon nitride segments. Alternatively, the continuous memory material layer 504L may comprise conductive nanoparticles such as metal nanoparticles, which can be, for example, ruthenium nanoparticles. The continuous memory material layer 504L can be formed, for example, by chemical vapor deposition (CVD), atomic layer deposition (ALD), physical vapor deposition (PVD), or any suitable deposition technique for storing electrical charges therein. The thickness of the continuous memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506L, 601L).

Referring to FIG. 2D, the optional first semiconductor channel layer 601L, the tunneling dielectric layer 506L, the continuous memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the continuous memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the continuous memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the continuous memory material layer 504L, and the at least one blocking dielectric layer (SOIL, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the continuous memory material layer 504L is herein referred to as a memory material layer 504. The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. Each remaining portion of the second blocking dielectric layer 503L is herein referred to as a second blocking dielectric 503. Each remaining portion of the first blocking dielectric layer SOIL is herein referred to as a first blocking dielectric 501.

A surface of the epitaxial channel portion 11 (or a surface of the semiconductor material layer 10 in case the epitaxial channel portions 11 are not employed) can be physically exposed underneath the opening through the first semiconductor channel portion 601, the tunneling dielectric 506, the memory material layer 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor material layer 10 in case epitaxial channel portions 11 are not employed) by a recess distance. A tunneling dielectric 506 is located over the memory material layer 504. A set of at least one blocking dielectric (501, 503), a memory material layer 504, and a tunneling dielectric 506 in a memory opening 49 constitutes a memory film 50, which includes a plurality of charge storage regions (as embodied as the memory material layer 504) that are insulated from surrounding materials by the at least one blocking dielectric (501, 503) and the tunneling dielectric 506.

In one embodiment, the first semiconductor channel portion 601, the tunneling dielectric 506, the memory material layer 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 or the semiconductor material layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is surrounded by a memory material layer 504, and laterally surrounds a portion of the semiconductor channel 60. Each adjoining set of a first blocking dielectric 501, a second blocking dielectric 503, a memory material layer 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

Referring to FIG. 2H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
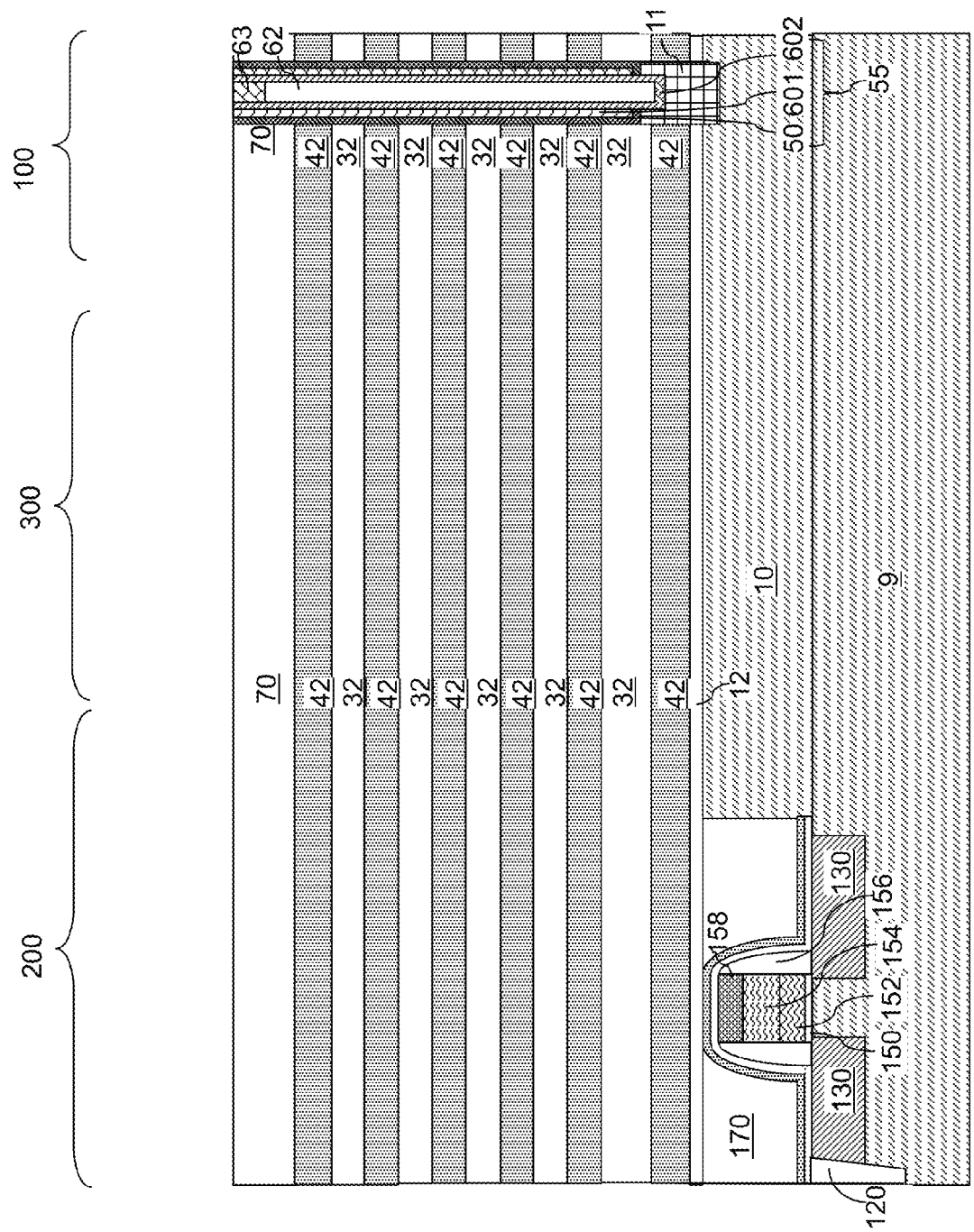
FIG. 3 is a vertical cross-sectional view of the first exemplary structure after formation of memory stack structures according to the first embodiment of the present disclosure.

The exemplary memory stack structure 55 can be embedded into the first exemplary structure illustrated in FIG. 1. FIG. 3 illustrates the first exemplary structure that incorporates multiple instances of the exemplary memory stack structure of FIG. 2H. Each exemplary memory stack structure 55 includes a semiconductor channel 60 (comprising layers 601, 602); a tunneling dielectric layer 506 laterally surrounding the semiconductor channel 60; and a vertical stack of charge storage regions laterally surrounding the tunneling dielectric layer 506 (as embodied as a memory material layer 504). The first exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor material layer 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for a specific embodiment of the memory stack structure, the methods of the present disclosure can be applied to alternative memory stack structures.

Figure 4:
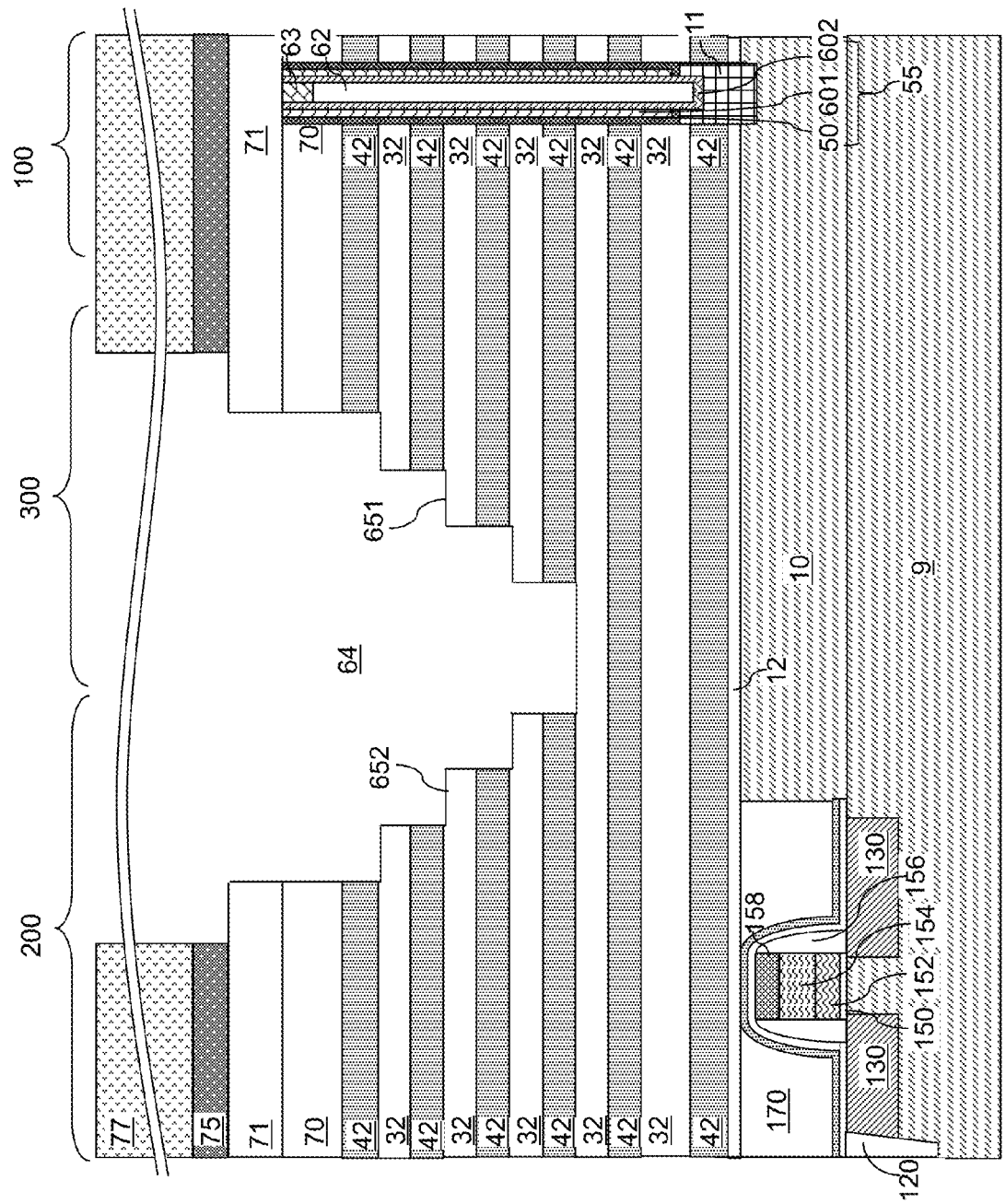
FIG. 4 is a vertical cross-sectional view of the first exemplary structure during formation of two sets of stepped surfaces according to the first embodiment of the present disclosure.

Referring to FIG. 4, an optional first contact level dielectric layer 71 can be formed over the semiconductor well layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

An optional hard mask layer 75 can be deposited over the first exemplary structure. The hard mask layer 75 includes a material that can be employed as a stopping material during a subsequent planarization process. In one embodiment, the hard mask layer 75 can include a dielectric material such as silicon nitride and/or silicon oxide. The hard mask layer 75 can be deposited, for example, by chemical vapor deposition. The thickness of the hard mask layer 75 may be in a range from 30 nm to 100 nm, although lesser and greater thicknesses can also be employed.

A trimming mask layer 77 can be formed over the hard mask layer 75. The trimming mask layer 77 includes a mask material that can be isotropically trimmed multiple times in subsequent processing steps. For example, the trimming mask layer 77 can include an organic polymer (e.g., photoresist) or an inorganic polymer. The trimming mask layer 77 can be patterned to form an initial opening in a peripheral area of the contact region 300, which can be adjacent to the peripheral device region. A set of anisotropic etch processes and a trimming process can be repetitively performed. Each set of anisotropic etch processes anisotropically etches a combination of an insulating layer 32 and a sacrificial material layer 42, thereby shifting the height of each step downward by two levels, which include a level of an insulating layer 32 and a level of a sacrificial material layer 42. Alternatively, more than two levels (such as integer multiples of two levels) may be etched during one or more sets of anisotropic etch processes. Each set of anisotropic etch processes can include at least one anisotropic etch process that etches the material of the insulating layers 32, and at least another anisotropic etch that etches the material of the sacrificial material layers 42.

Each trimming process can isotropically etch the remaining portion of the trimming mask layer 77. If a hard mask layer 75 is employed, each trimming process can expand the area of the opening in the hard mask layer 75 and collaterally thin the trimming mask layer 77. First stepped surfaces 651 and second stepped surfaces 652 are formed within a cavity 64 underlying an opening in the trimming mask layer 77 and the hard mask layer 75.

Two sets of stepped surfaces (651, 652) are formed through the repetitive performance of the set of anisotropic etch processes and the trimming process. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces. The set of anisotropic etch processes and the trimming process can alternate until the stepped surfaces (651, 652) extend to the bottommost layers within the alternating stack (32, 42). The alternating stack (32, 42) is an in-process structure, i.e., an in-process alternating stack that is modified in shape during formation of the stepped surfaces (651, 652). As used herein, an "in-process" structure refers to a structure that is modified either in structure or composition during a sequence of processing steps.

Figure 5:
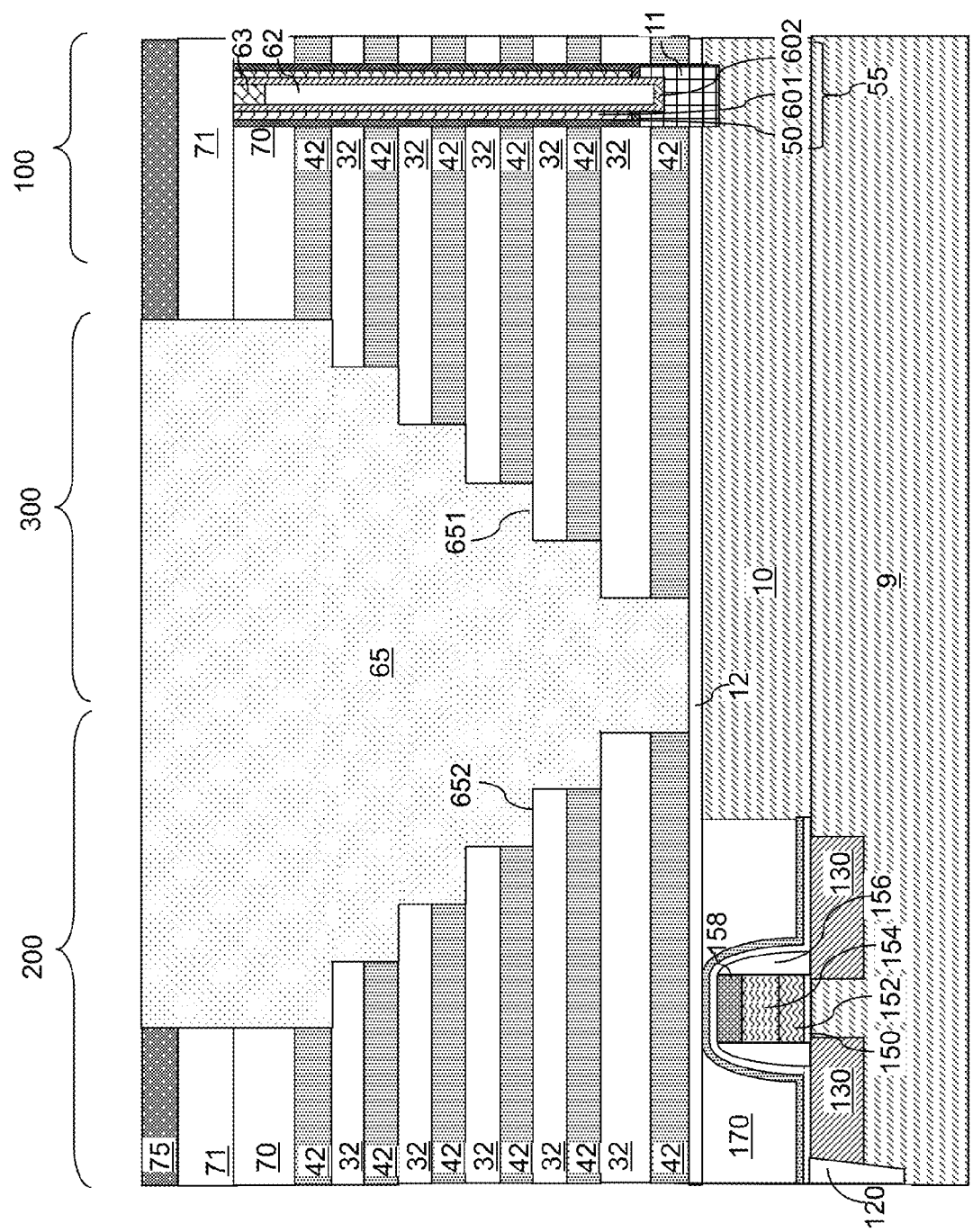
FIG. 5 is a vertical cross-sectional view of the first exemplary structure after formation of two sets of stepped surfaces and a retro-stepped dielectric material portion according to an embodiment of the present disclosure.

Referring to FIG. 5, the two sets of stepped surfaces (651, 652) can be formed by dividing the in-process alternating stack (32, 42) into a first alternating stack (32, 42) located in the device region 100 and extending into the contact region 300, and a second alternating stack (32, 42) formed in the peripheral device region 200. The first alternating stack has first stepped surfaces 651, and the second alternating stack has second stepped surfaces 652.

A dielectric material such as silicon oxide is deposited in the stepped cavity and over the peripheral devices in the peripheral device region 200 and in the contact region 300. Excess portions of the deposited dielectric material can be removed from above the top surface of the hard mask layer 75, for example, by chemical mechanical planarization (CMP). The remaining portion of the deposited dielectric material filling the stepped cavity in the contact region 300 and the peripheral device region 200 and overlying the semiconductor well layer 10 in the peripheral device region 200 constitutes a retro-stepped dielectric material portion 65. The retro-stepped dielectric material portion 65 is formed over the first stepped surfaces 651 and the second stepped surfaces 652.

As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the hard mask layer 75.

Figure 6:
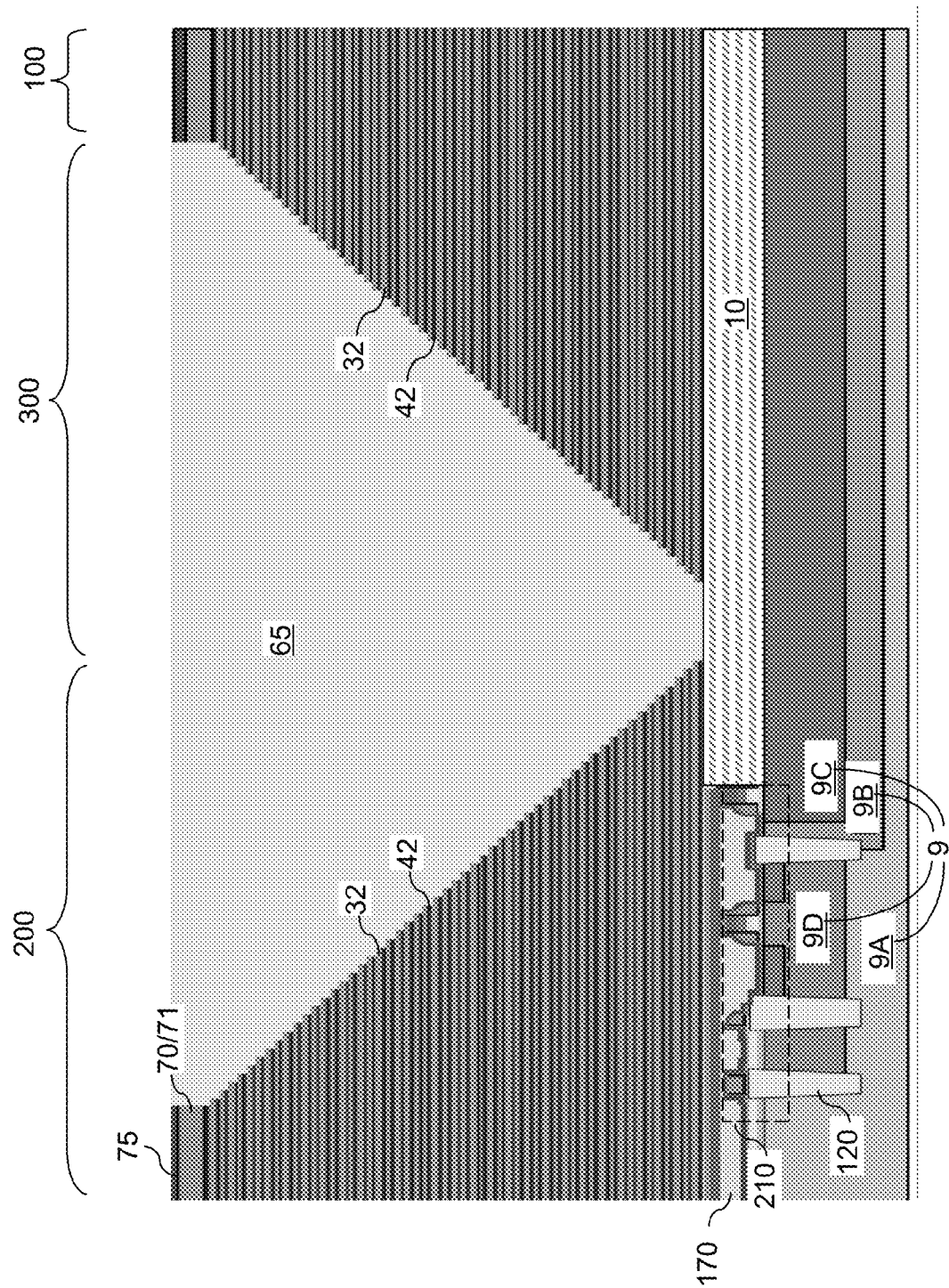
FIG. 6 is a vertical cross-sectional view of another embodiment of the first exemplary structure that employs a greater number of layers in an alternating stack at the processing step of FIG. 5.

FIG. 6 illustrates another embodiment of the first exemplary structure, which employs a greater number of layers in an alternating stack at the processing step of FIG. 5. The substrate semiconductor layer 9 can include various doped well regions (9A, 9B, 9C, 9D), which may be p-doped or n-doped. The peripheral semiconductor devices 210 can include a plurality of metal-oxide-semiconductor (MOS) field effect transistors, such a word line or bit line driver transistors, include sense amplifier circuit, charge pump circuit devices, reference voltage and current circuit, and/or power-on circuit transistors and other devices, such as capacitors and/or diodes.

The hard mask layer 75 can be subsequently removed. In one embodiment, the top surface of the retro-stepped dielectric material portion 65 can be vertically recesses so that the top surface of the first contact level dielectric layer 71 is coplanar with the top surface of the retro-stepped dielectric material portion 65.

Figure 7A:
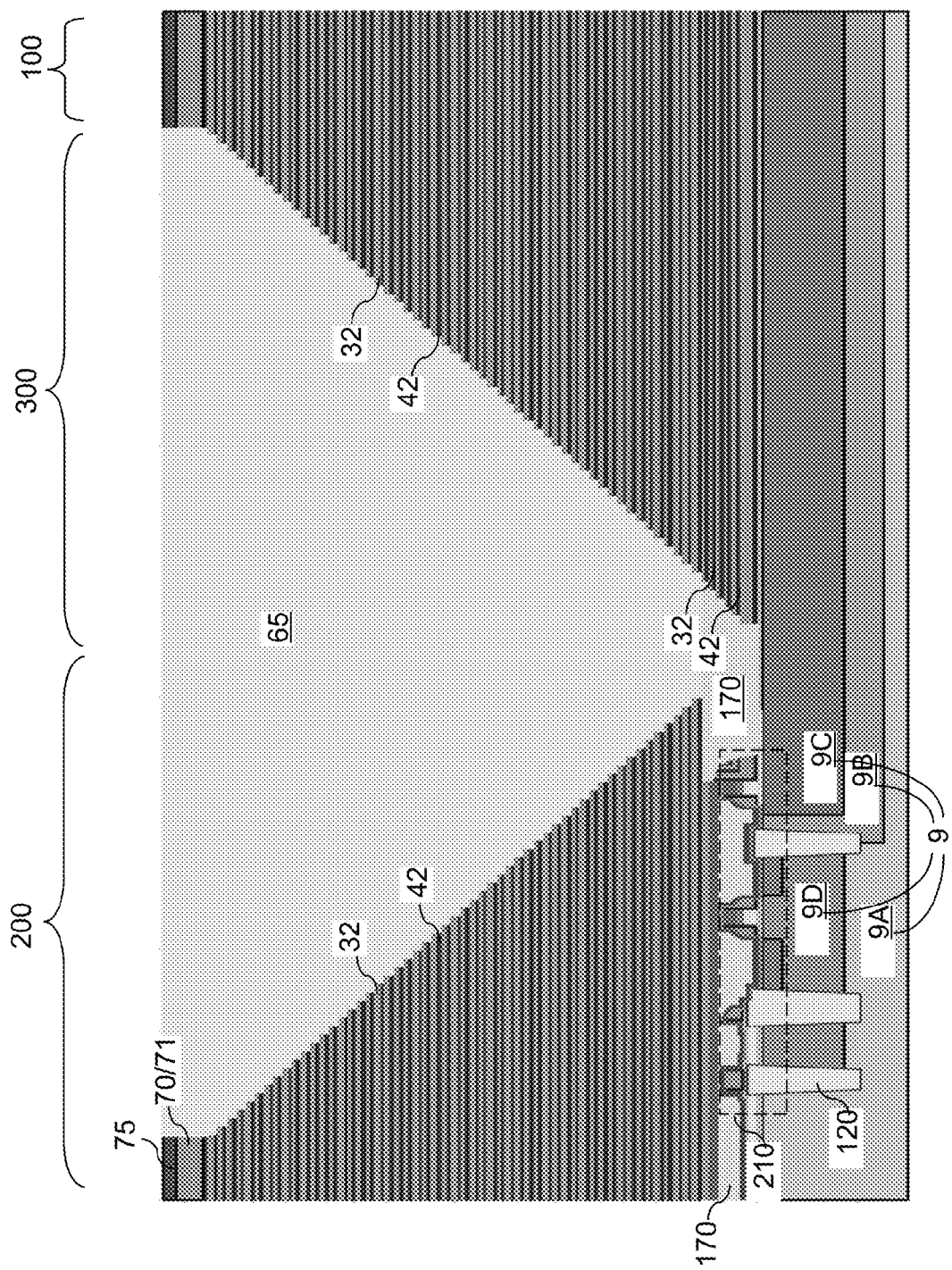
FIG. 7A is a vertical cross-sectional view of yet another embodiment of the first exemplary structure at the processing step of FIG. 5.

FIG. 7A illustrates yet another embodiment of the first exemplary structure, which includes additional insulating layers 32 and additional sacrificial material layers 42 in lieu of a semiconductor well layer 10. Thus, the first stack in the device region 100 includes more number of insulating layers 32 and sacrificial material layers 42 than the second stack 200 (i.e., the first stack has more levels and more dielectric layers 32 than the second stack) in this embodiment.

FIG. 7B illustrates still another embodiment of the first exemplary structure at the processing step corresponding to FIG. 3. In this embodiment, formation of a semiconductor well layer 10 is omitted, and the number of the insulating layers 32 and the sacrificial material layers 42 can be the same across the device region, the peripheral device region 200, and the contact region 300. The top surface of the hard mask layer 75 can be sloped around the boundary between the peripheral device region 200 and the contact region 300.

Figure 7C:
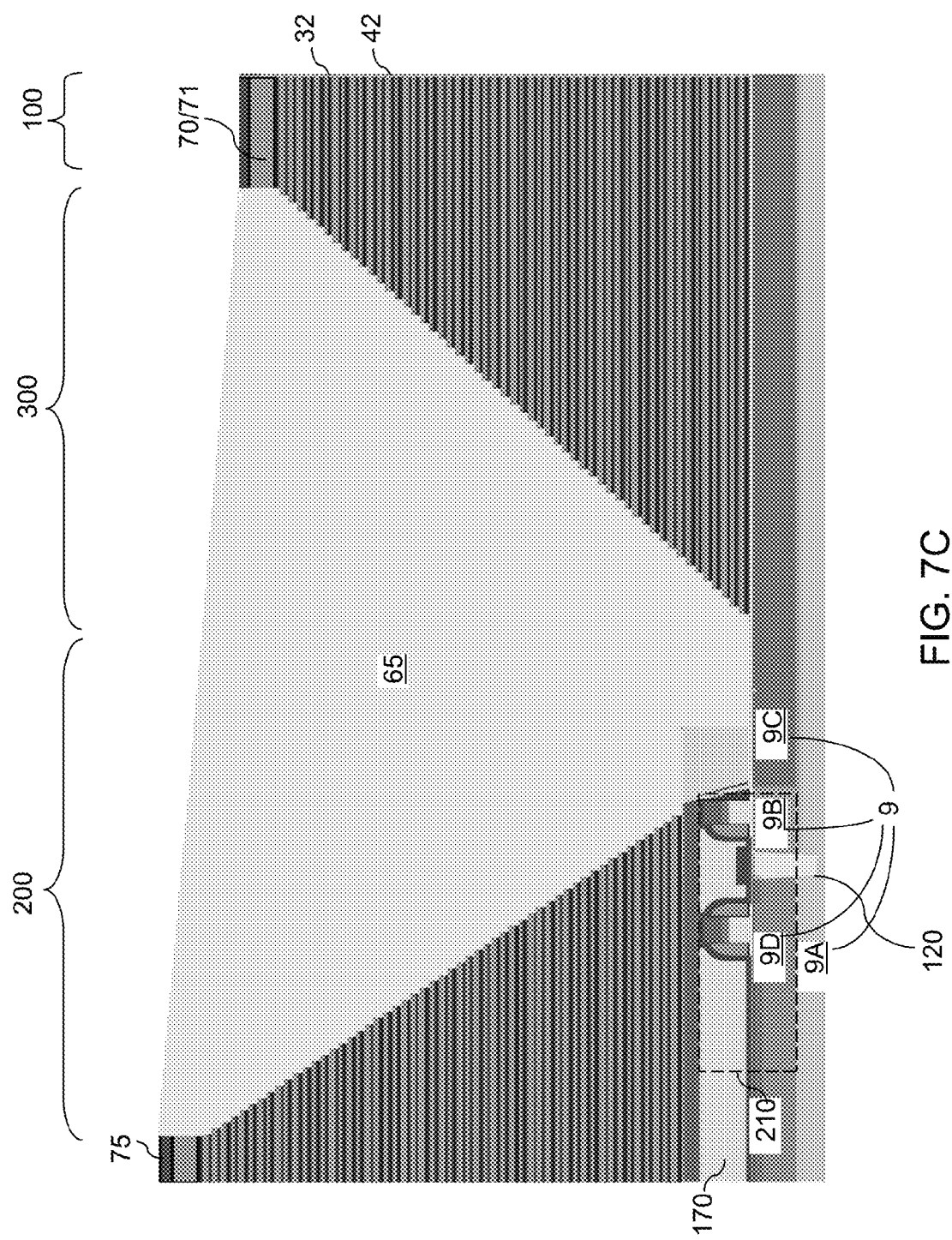
FIG. 7C is a vertical cross-sectional view of the embodiment of present disclosure of FIG. 7B at the processing step of FIG. 5 according to an embodiment of the present disclosure.

Referring to FIG. 7C, the processing steps of FIGS. 4 and 5 can be performed to form the stepped surfaces and the retro-stepped dielectric material portion 65. The top surface of the hard mask layer 75 in the peripheral device region 200 can be raised above the top surface of the hard mask layer 75 in the device region 100. The top surface of the retro-stepped dielectric material portion 65 may be slanted, i.e., at a finite angle with respect to a horizontal plane. The angle of the slant may be in a range from 1 degree to 10 degrees, although lesser and greater angles can also be employed.

Figure 8A:
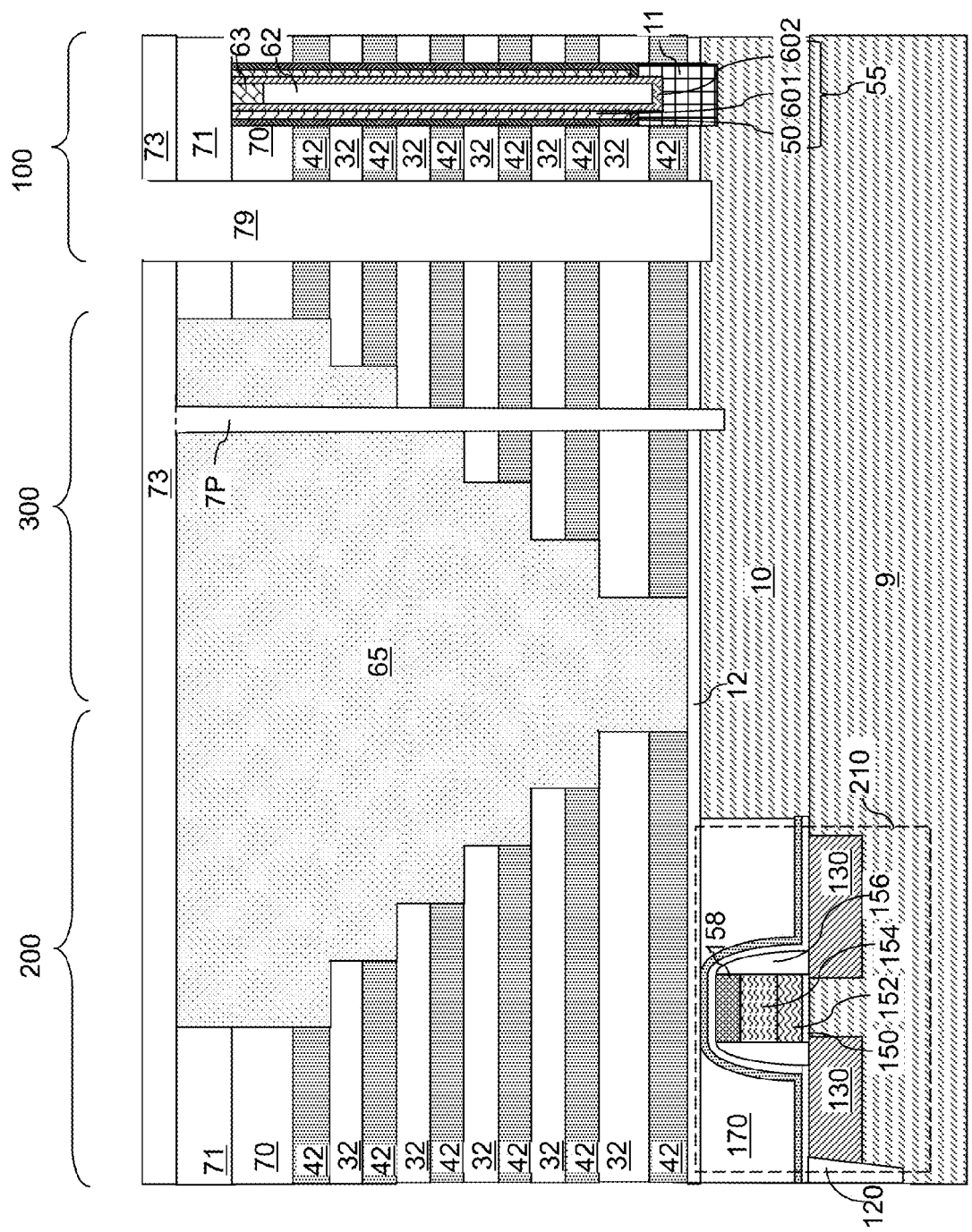
FIG. 8A is a vertical cross-sectional view of the first exemplary structure after formation of dielectric pillar structures and formation of backside trenches according to the first embodiment of the present disclosure.
Figure 8B:
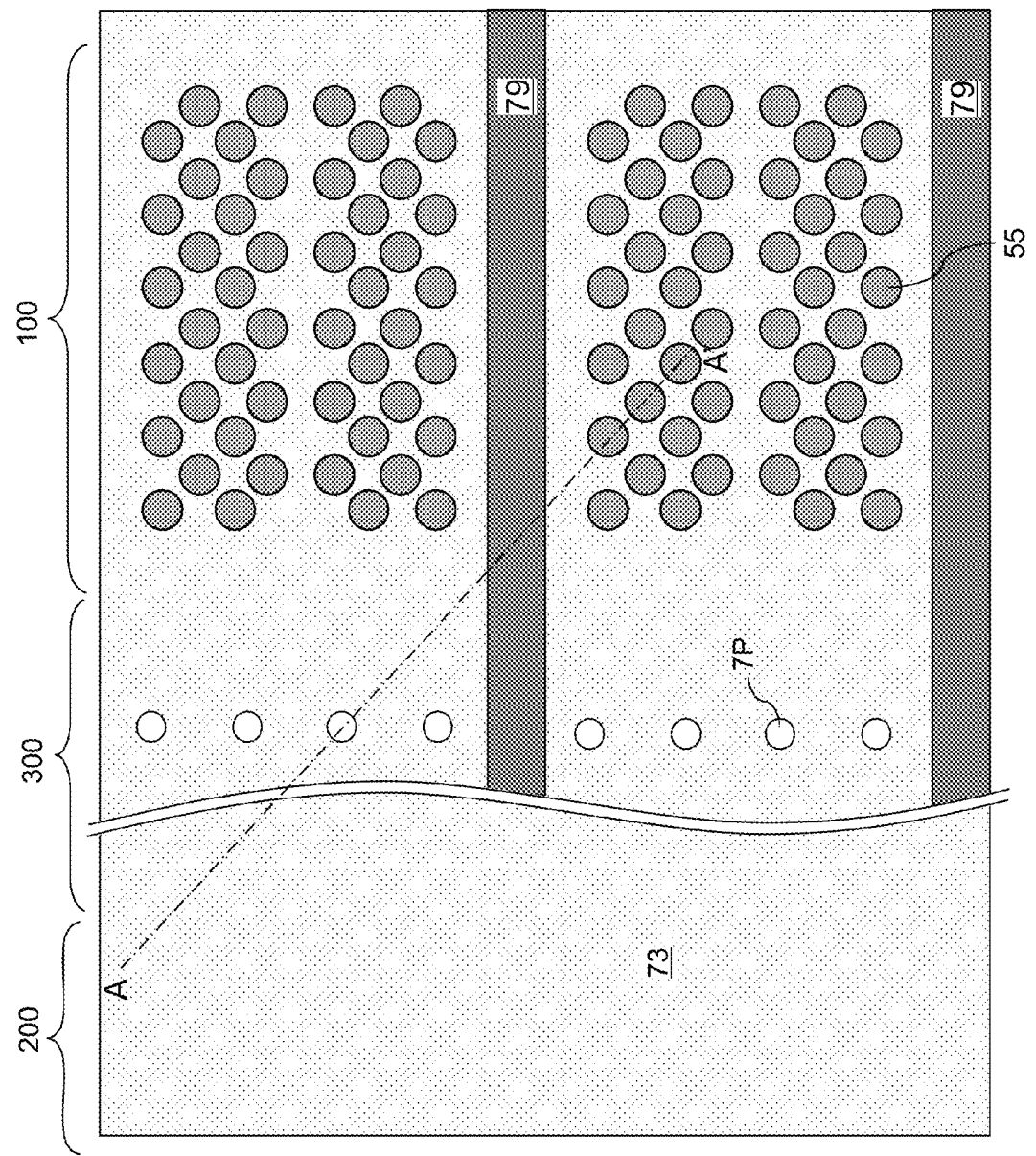
FIG. 8B is a see-through top-down view of the first exemplary structure of FIG. 5A. The vertical plane A-A' is the plane of the vertical cross-sectional view of FIG. 8A.

Referring to FIGS. 8A and 8B, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the semiconductor well layer 10, and by filling the opening with a dielectric material that is resistant to the etch chemistry to be employed to remove the sacrificial material layers 42. While a particular pattern for arrangement of the memory stack structures 55 and the dielectric support pillars 7P are illustrated in the drawings, it is understood that various other patterns may also be employed for the memory stack structures 55 and the dielectric support pillars 7P.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Trenches (which are herein referred to as backside trenches 79) can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). Each backside trench 79 cuts through the first alternating stack (32, 42) located in the device region 100 and the contact region 300, and does not cut through the second alternating stack (32, 42) located in the peripheral device region 200. Each backside trench 79 extends through the in-process alternating stack (32, 42) and to the top surface of the substrate (9, 10). A top surface of the semiconductor well layer 10 can be physically exposed at the bottom of each backside trench 79. In one embodiment, each backside trench 79 can extend along a first horizontal direction so that clusters of the memory stack structures 55 are laterally spaced along a second horizontal direction that is different from the first horizontal direction.

The alternating stack of insulating layers 32 and the sacrificial material layers 42 is an in-process structure, i.e., an in-process alternating stack. The in-process alternating stack is subsequently modified by replacement of the sacrificial material layers 42 with electrically conductive layers.

Figure 9:
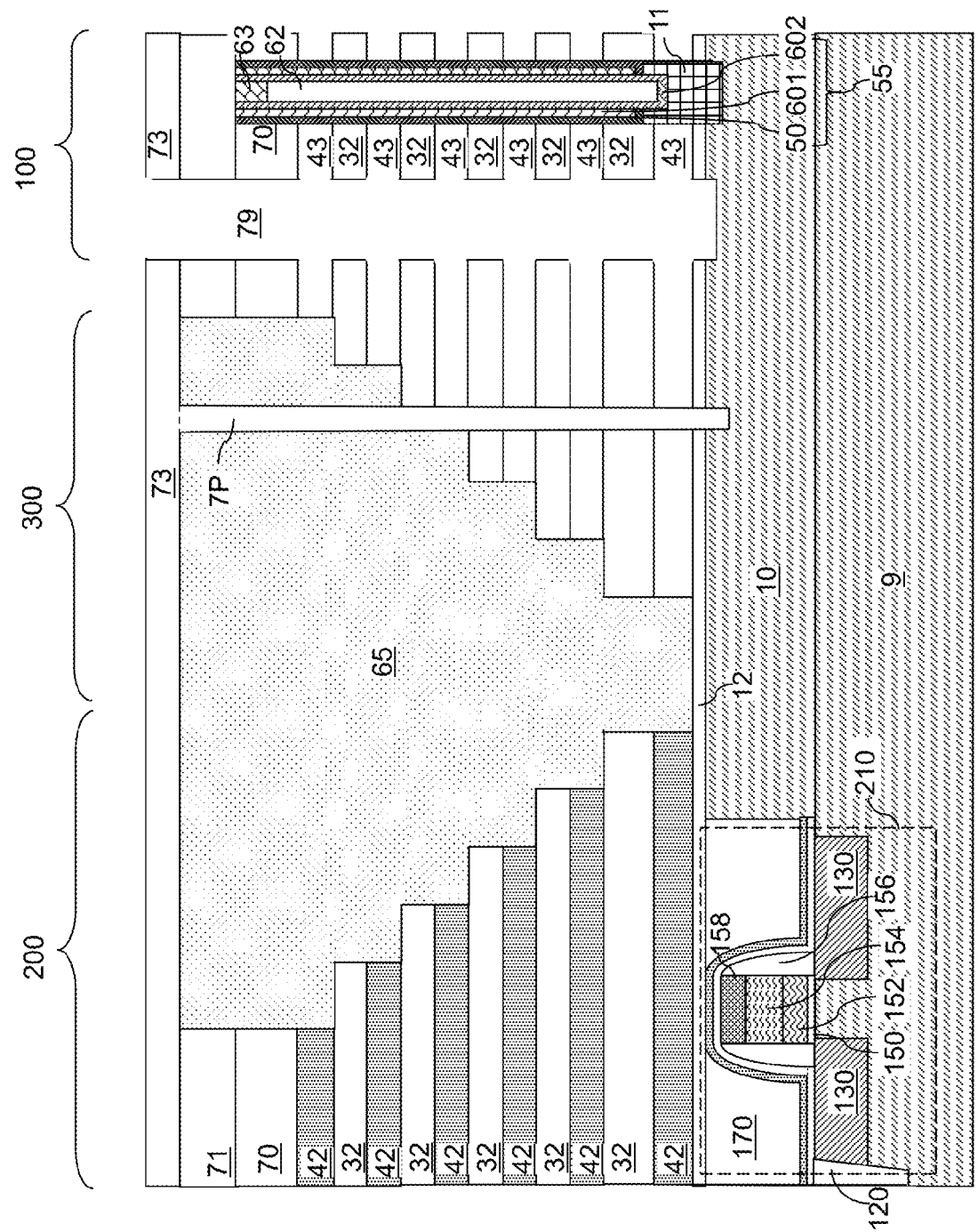
FIG. 9 is a vertical cross-sectional view of the first exemplary structure after formation of backside recesses according to the first embodiment of the present disclosure.

Referring to FIG. 9, an etchant that selectively etches the second material of the sacrificial material layers 42 with respect to the first material of the insulating layers 32 can be introduced through the backside trenches 79, for example, employing an etch process. Recesses (which are herein referred to as backside recesses 43) are formed in volumes from which the sacrificial material layers 42 are removed. The backside trenches 79 and the backside recesses 43 are formed from locations away from the memory stack structures 55, which are formed within memory openings 49 that are also referred to as front side openings. Thus, the recesses 43 may be formed in the first stack in region 100 but not in the second stack in region 200, where the sacrificial material layers 42 remain.

The removal of the second material of the sacrificial material layers 42 can be selective to the first material of the insulating layers 32, the material of the dielectric support pillars 7P, the material of the retro-stepped dielectric material portion 65, the semiconductor material of the semiconductor well layer 10, and the material of the outermost layer of the first memory films 50. In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the dielectric support pillars 7P, and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor well layer 10.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures 55 are formed are herein referred to as front side openings or holes in contrast with the backside recesses 43. In one embodiment, the device region 100 comprises an array of monolithic three-dimensional NAND strings having a plurality of device levels disposed above the substrate (e.g., above the semiconductor well layer 10). In this case, each backside recess 43 can define a space for receiving a respective word line of the array of monolithic three-dimensional NAND strings.

Each of the plurality of backside recesses 43 can extend substantially parallel to the top surface of the semiconductor well layer 10. A backside recess 43 can be vertically bounded by a top surface of an underlying insulating layer 32 and a bottom surface of an overlying insulating layer 32. In one embodiment, each backside recess 43 can have a uniform height throughout. Alternatively, the backside recesses 43 may have height variations. Optionally, a backside blocking dielectric layer can be formed in the backside recesses.

Figure 10:
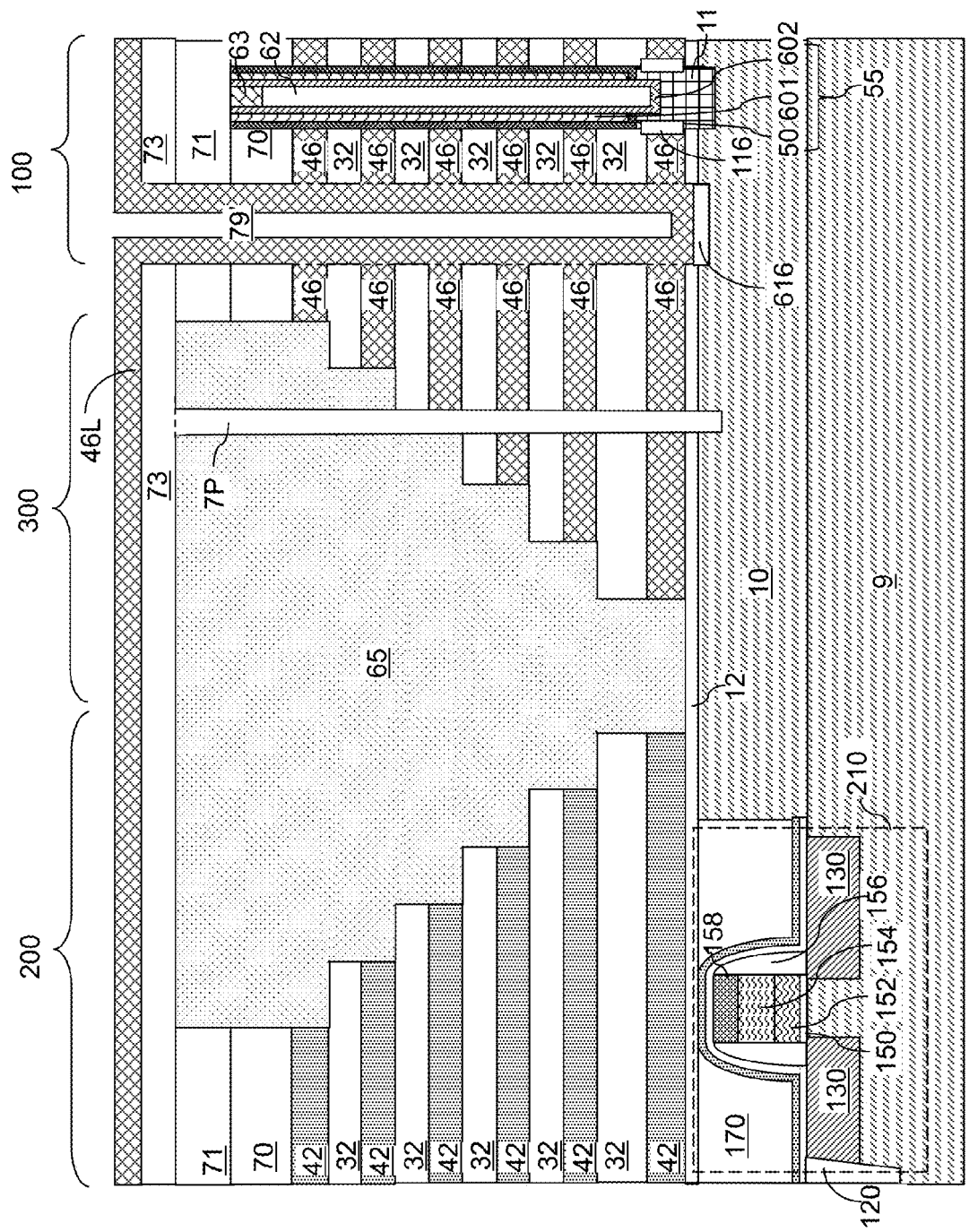
FIG. 10 is a vertical cross-sectional view of the first exemplary structure after formation of electrically conductive layers according to the first embodiment of the present disclosure.

Subsequently, physically exposed surface portions of epitaxial channel portions 11 and the semiconductor material layer 10 can be converted into dielectric material portions by thermal conversion and/or plasma conversion of the semiconductor materials into dielectric materials. For example, as shown in FIG. 10, thermal conversion and/or plasma conversion can be employed to convert a surface portion of each epitaxial channel portion 11 into a dielectric spacer 116, and to convert each physically exposed surface portion of the semiconductor material layer 10 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the semiconductor material layer 10 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the semiconductor material layer 10.

A backside blocking dielectric layer (not shown) can be optionally formed. The backside blocking dielectric layer, if present, comprises a dielectric material that functions as a control gate dielectric for the control gates to be subsequently formed in the backside recesses 43.

In case at least one blocking dielectric is present within each memory stack structure 55, the backside blocking dielectric layer is optional. In case a blocking dielectric is not present in the memory stack structures 55, the backside blocking dielectric layer is present.

Referring to FIG. 10, at least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element. The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas can comprise a compound of at least one tungsten atom and at least one fluorine atom. For example, if the metallic material includes tungsten, WF6 and H2 can be employed during the deposition process.

A plurality of electrically conductive layers 46 can be formed in the plurality of backside recesses 43, and a continuous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L.

Portions of the sacrificial material layers 42 in the first alternating stack (32, 42) in the device region 100 and the contact region 300 are replaced with electrically conductive layers 46, while portions of the sacrificial material layers 42 in the second alternating stack (32, 42) in the peripheral regions 200 are left intact through the replacement of the sacrificial material layers 42 in the first alternating stack (32, 42) with the electrically conductive layers 46. Thus, the first stack in region 100 is a stack of insulating layers 32 and electrically conductive layers 46, while the second stack in region 200 is a stack of insulating layers 32 and insulating sacrificial material layers 42 (i.e., a dielectric stack).

Figure 11:
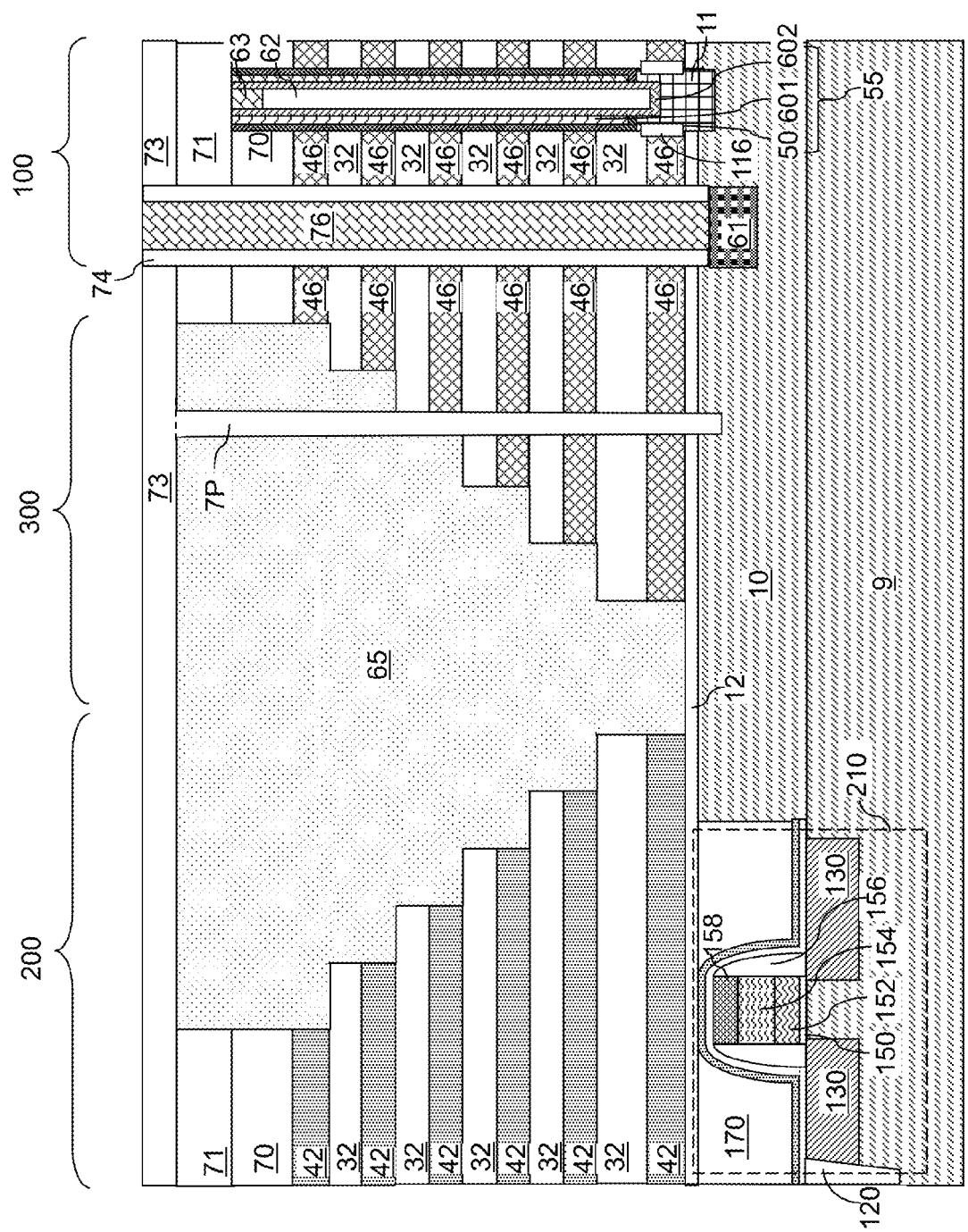
FIG. 11 is a vertical cross-sectional view of the first exemplary structure after formation of an insulating spacer and a via contact structure in a backside contact trench according to the first embodiment of the present disclosure.

Referring to FIG. 11, the deposited metallic material of the continuous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed during the last processing step of the anisotropic etch. Each backside trench 79 extends through the alternating stack (32, 46) of the insulating layers 32 and the electrically conductive layers 46 and to the top surface of the substrate (9, 10).

In one embodiment, source regions 61 can be formed in, or on, portions of the semiconductor well layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

An insulating material layer can be formed in each backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the second contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. Each insulating spacer 74 laterally surrounds a cavity, which is herein referred to as a backside cavity. A top surface of a source region 61 (which is a doped semiconductor material portion) can be physically exposed at the bottom of each backside cavity that is provided within an insulating spacer 74.

Electrical dopants can be implanted into each surface portion of the semiconductor well layer 10 that underlies the backside cavities to form source regions 61. Each source region 61 can have a doping of a second conductivity type, which is the opposite of the first conductivity type. For example, if the semiconductor material layer as a p-type doping, the source regions 61 can have an n-type doping.

At least one conductive material can be deposited in the backside cavities, for example, by physical vapor deposition, electroplating, chemical vapor deposition, electroless plating, or a combination thereof. Excess portion of the at least one conductive material can be removed, for example, by chemical mechanical planarization. Each remaining portion of the at least one conductive material that fills a respective backside cavity constitutes a backside contact via structure 76, which can be a source contact local interconnect that contacts a respective source region 61.

Figure 12:
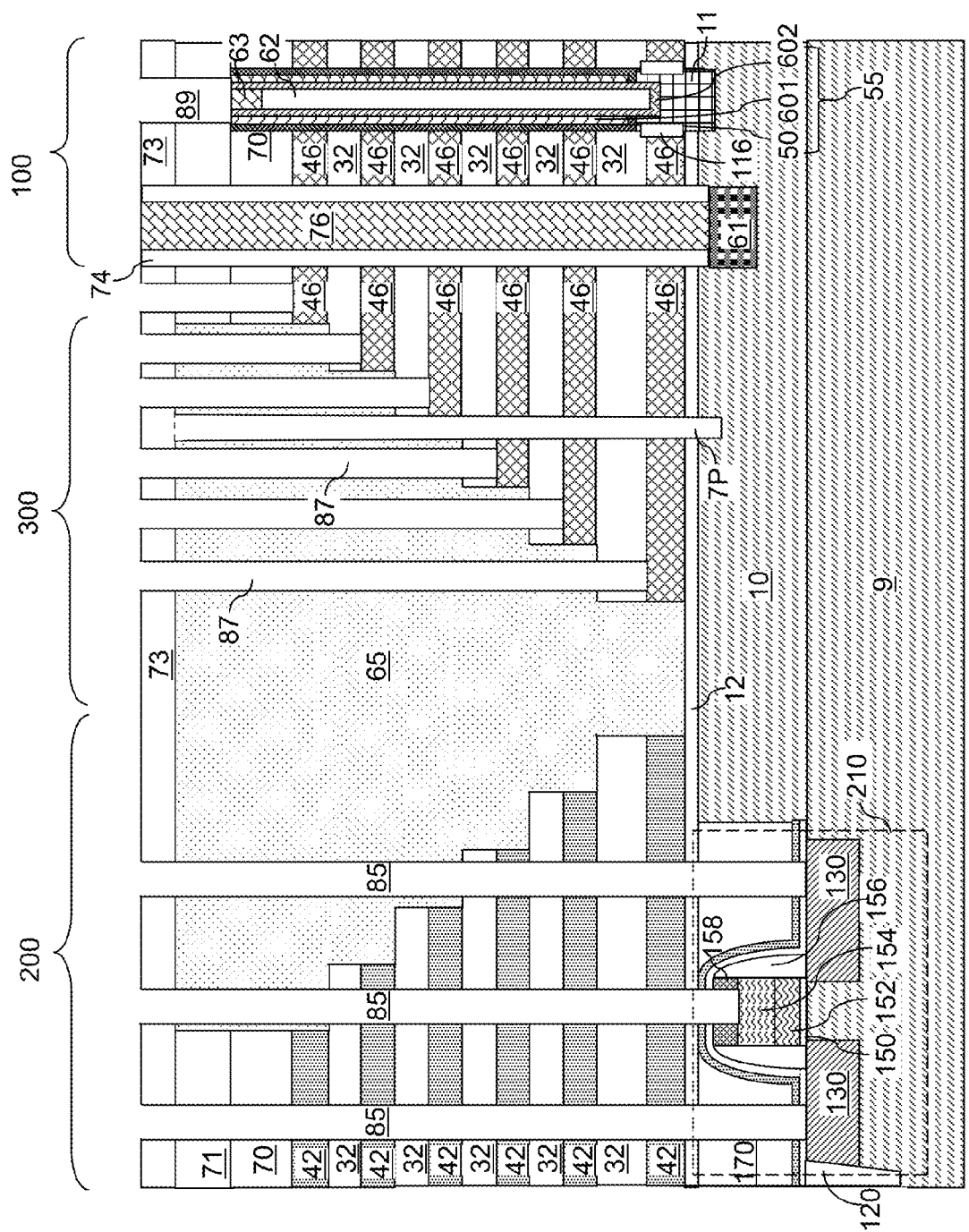
FIG. 12 is a vertical cross-sectional view of the first exemplary structure after formation of various via cavities according to the first embodiment of the present disclosure.

Referring to FIG. 12, various via cavities (85, 87, 89) can be formed through the retro-stepped dielectric material portion 65, the at least one contact level dielectric layer (71, 73), and the second alternating stack of insulating layers 32 and sacrificial material layers 42, which are insulating spacer material layers. Specifically, the various via cavities (85, 87, 89) can include peripheral device contact via cavities 85 that are formed in the peripheral device region 200 and extending from a top surface of the at least one contact level dielectric layer (71, 73) to peripheral devices (e.g., transistors) 210. Additionally, the various via cavities (85, 87, 89) can include word line contact via cavities 87, which are formed in the in the contact region 300 and extend from the top surface of the at least one contact level dielectric layer (71, 73) to respective electrically conductive layers 46. Further, drain contact via cavities 89 can be formed over each memory stack structure 55 to extend to a drain region 63.

In an alternative embodiment, the peripheral device contact via cavities 85 may be formed at a different time than that shown in FIG. 12. For example, the peripheral device contact via cavities 85 may be formed at the same time as the memory openings 49. For example, the same mask (e.g., photoresist mask) may be used during the etching both the cavities 85 and the openings 49 using the same etching gas or liquid during the same etching step. The cavities 85 may have a larger diameter than the openings 49. In another alternative embodiment, the cavities 85 may be formed in a separate step from the steps used to etch the openings 49 and the other cavities 87 and 89.

Figure 13:
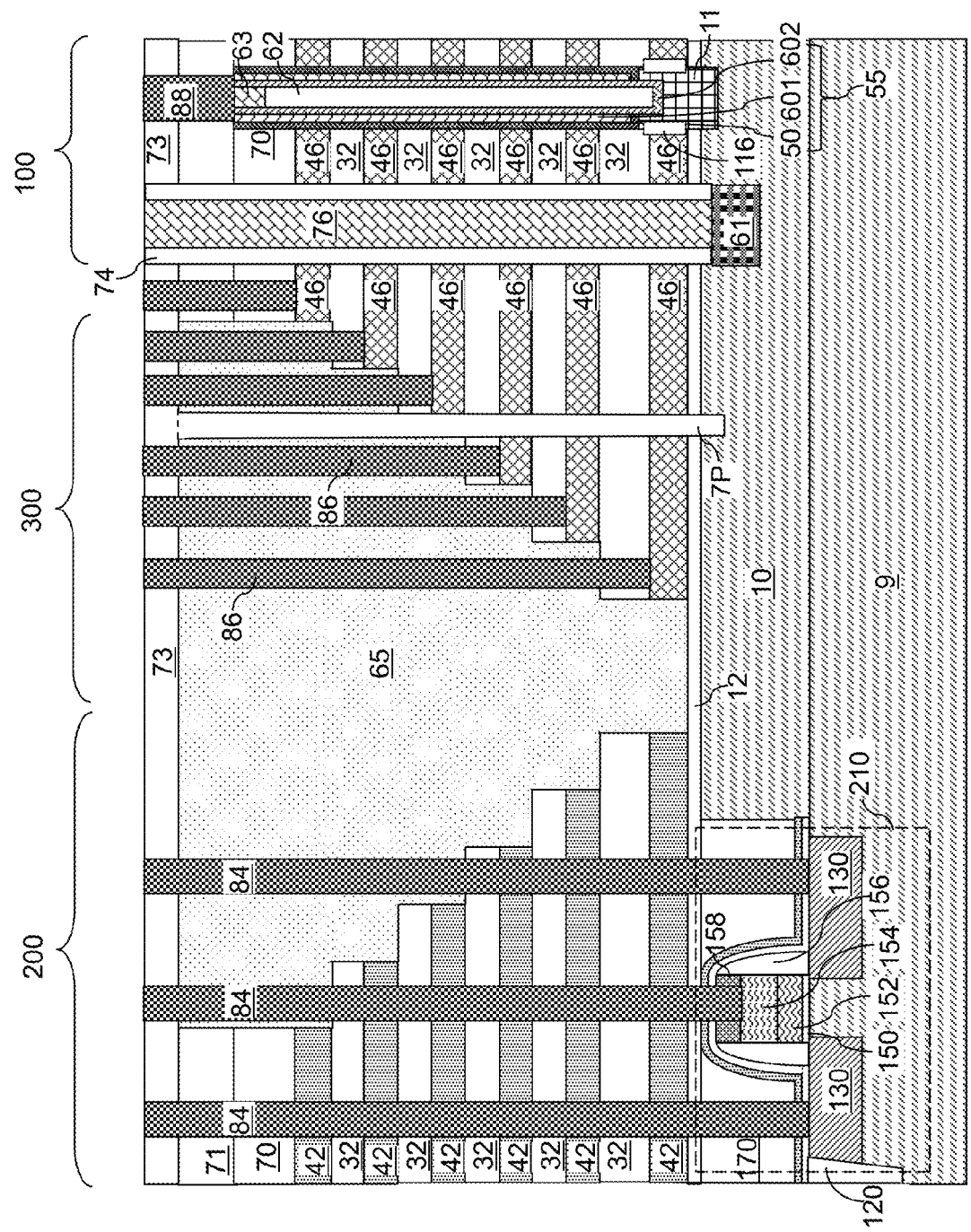
FIG. 13 is a vertical cross-sectional view of the first exemplary structure after formation of various contact via structures according to the first embodiment of the present disclosure.

Referring to FIG. 13, at least one conductive material is deposited in the various via cavities (85, 87, 89) to form contact via structures (84, 86, 88). Excess portions of the at least one conductive material can be removed from above the top surface of the at least one contact level dielectric layer (71, 73) by a planarization process. The contact via structures (84, 86, 88) can include peripheral device contact via structures 84 that are formed in the peripheral device region 200 and contact nodes (i.e., source and drain regions 130 and/or the gate electrodes 154) of peripheral devices 210 (which may include driver circuits for bit lines and word lines of the array of memory devices in the device region 100), word line contact via structures 86 that contact respective electrically conductive layers 46 that function as word lines, and drain contact via structures 88 that contact respective drain regions 63 overlying the memory stack structures 50. The peripheral device contact via structures 84 contact various nodes of the peripheral devices, and can be formed directly on sidewalls of the insulating layers 32 and the spacer material layers (i.e., the sacrificial material layers 42) within the second alternating stack (32, 42) in the peripheral region 200. In some embodiments, at least one of the peripheral device contact via structures 84 may pass through the retro-stepped dielectric material layer 65.

Figure 14:
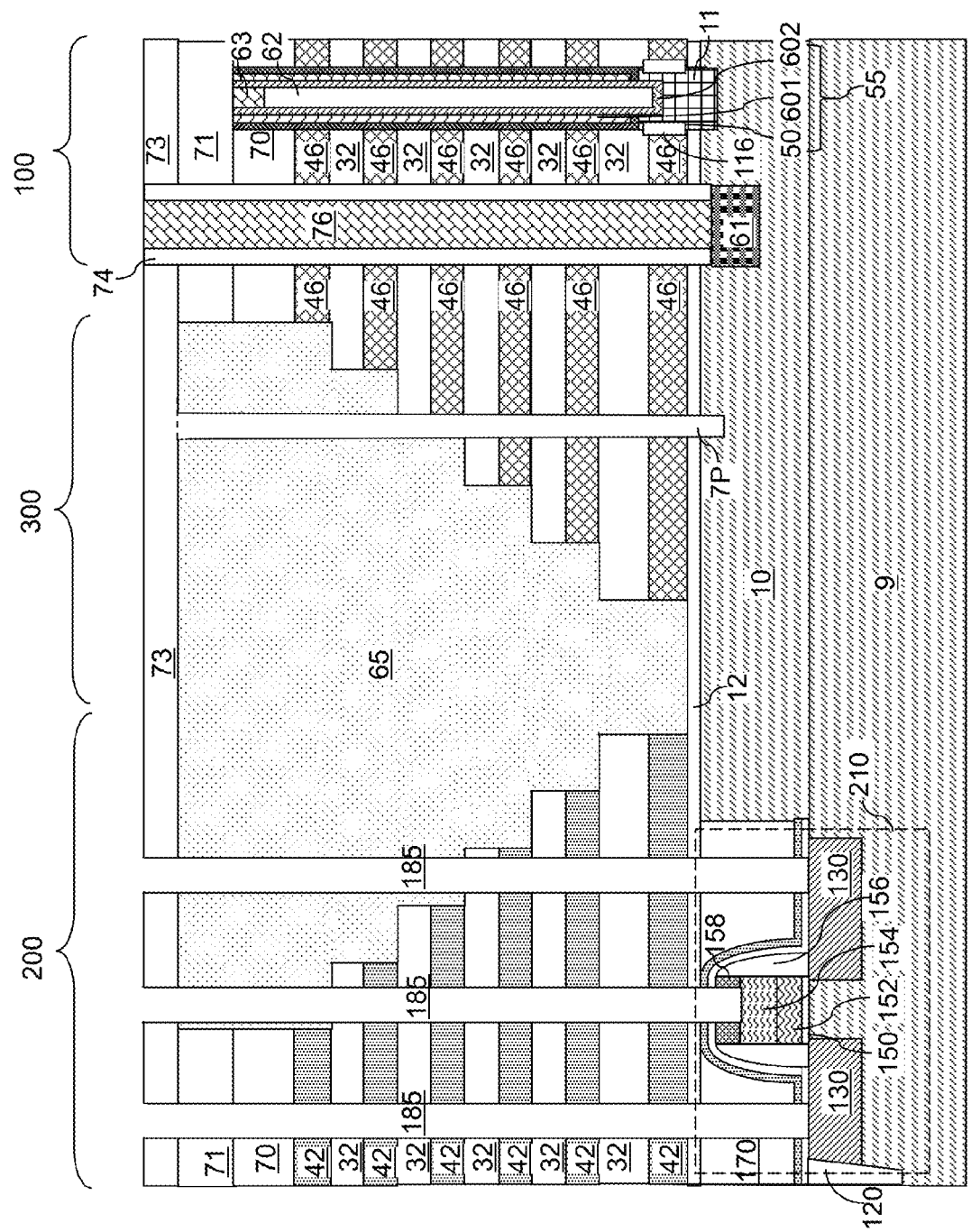
FIG. 14 is a vertical cross-sectional view of a second exemplary structure after formation of peripheral via cavities according to a second embodiment of the present disclosure.

Referring to FIG. 14, a second exemplary structure can be derived from the first exemplary structure of FIG. 11 by forming peripheral device contact via cavities 185 in the peripheral device region 200 at any time after forming the second stack in region 200. Each peripheral device contact via cavity 185 can extend through at least some layers of the second alternating stack (32, 42) and to a node of the semiconductor devices in the peripheral device region 200. In some embodiments, at least one of the peripheral device contact via cavities 185 can extend through the retro-stepped dielectric material portion 65.

Figure 15:
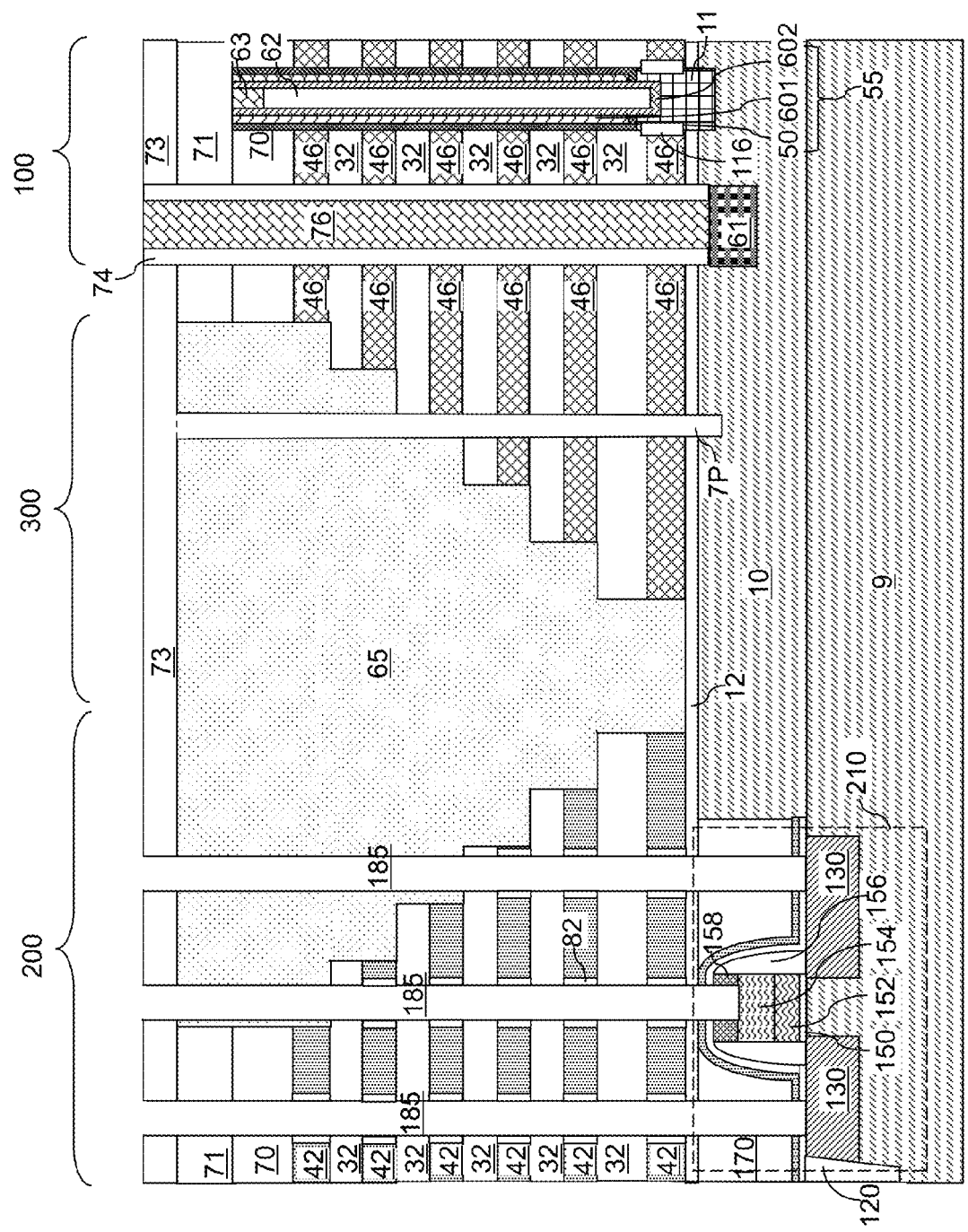
FIG. 15 is a vertical cross-sectional view of the second exemplary structure after formation of circumferential spacers by conversion of surface portions of spacer material layers according to the second embodiment of the present disclosure.

Referring to FIG. 15, circumferential spacers 82 can be formed by conversion of surface portions of spacer material layers (i.e., the sacrificial material layers 42) into annular dielectric material portions having a different composition. As used herein, a "circumferential spacer" refers to a spacer extending around a circumference of a cavity. As such, a circumferential spacer can have an annular shape, i.e., a ring shape. In one embodiment, the circumferential spacers 82 can have a lower dielectric constant than the material of the sacrificial material layers 42. For example, the sacrificial material layers 42 can include silicon nitride, and the circumferential spacers 82 can be formed by thermal oxidation or plasma oxidation (e.g., by in-situ steam generation, ISSG, oxidation) of surface portions of the silicon nitride to form silicon oxide portions or silicon oxynitride portions. Alternatively, the circumferential spacers 82 can be formed by laterally recessing the sacrificial material layers 42, depositing silicon oxide or organosilicate glass, and anisotropically etching the deposited material so that remaining portions of the deposited dielectric material fill the lateral recesses and form the circumferential spacers 82.

The circumferential spacers 82 can be formed at levels of the spacer material layers (i.e., the sacrificial material layers 42) in the second alternating stack. The lateral thickness (i.e., the smallest lateral distance between the inner sidewall and the outer sidewall) of each circumferential spacer 82 can be in a range from 3 nm to 100 nm, although lesser and greater thicknesses can also be employed. A touch-up anisotropic etch can be employed to remove any collateral oxide material that may be formed at the bottom of the peripheral device contact via cavity 185.

Figure 16:
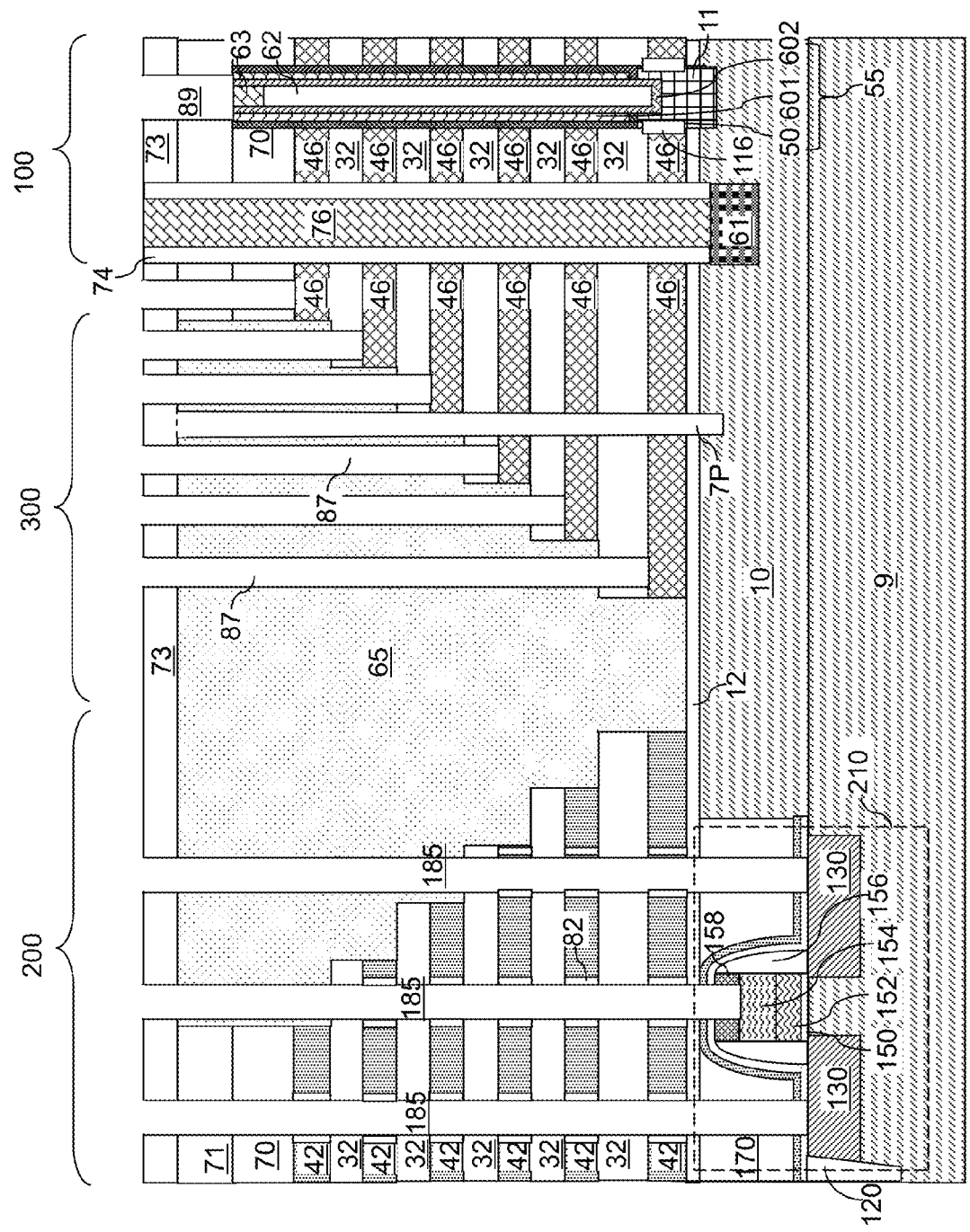
FIG. 16 is a vertical cross-sectional view of the second exemplary structure after formation of additional via cavities according to the second embodiment of the present disclosure.

Referring to FIG. 16, additional contact via cavities (87, 89) can be formed in the device region 100 and the contact region 300. A combination of lithographic patterning of a photoresist layer and a pattern transfer employing an anisotropic etch can be employed to form the additional contact via cavities (87, 89). The additional contact via cavities (87, 89) can include word line contact via cavities 87, which are formed in the in the contact region 300 and extend from the top surface of the at least one contact level dielectric layer (71, 73) to respective electrically conductive layers 46. Further, drain contact via cavities 89 can be formed over each memory stack structure 55.

Figure 17:
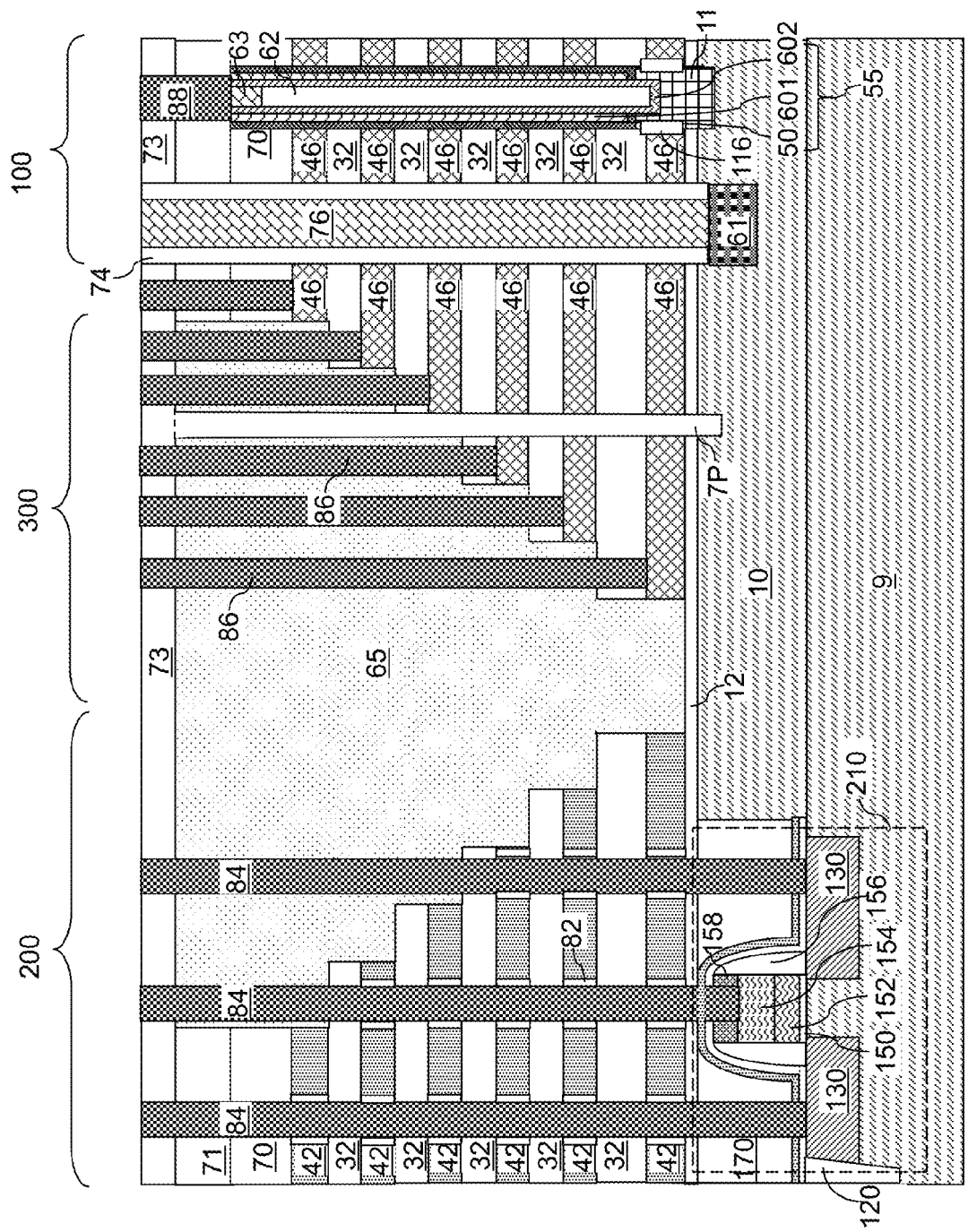
FIG. 17 is a vertical cross-sectional view of the second exemplary structure after formation of contact via structures according to the second embodiment of the present disclosure.

Referring to FIG. 17, at least one conductive material is deposited in the various via cavities (185, 87, 89) to form contact via structures (84, 86, 88). Excess portions of the at least one conductive material can be removed from above the top surface of the at least one contact level dielectric layer (71, 73) by a planarization process. The contact via structures (84, 86, 88) can include peripheral device contact via structures 84 that are formed in the peripheral device region 200 and contact nodes of peripheral devices, word line contact via structures 86 that contact respective electrically conductive layers that function as word lines, and drain contact via structures 88 that contact respective drain regions 63 overlying the memory stack structures 50. The peripheral device contact via structures 84 contact various nodes of the peripheral devices, and can be formed directly on sidewalls of the insulating layers 32 and the circumferential spacers 82. In some embodiments, at least one of the peripheral device contact via structures 84 may pass through the retro-stepped dielectric material layer 65. In one embodiment, the spacer material layers 42 comprise silicon nitride, the circumferential spacers 82 comprise a material selected from silicon oxide or silicon oxynitride, which can be derived by conversion of surface portions of the silicon nitride of the spacer material layers 42. The spacers 82 reduce capacitive coupling between adjacent structures 84 due to the lower dielectric constant of the spacers 82 compared to that of the layers 42.

Figure 18:
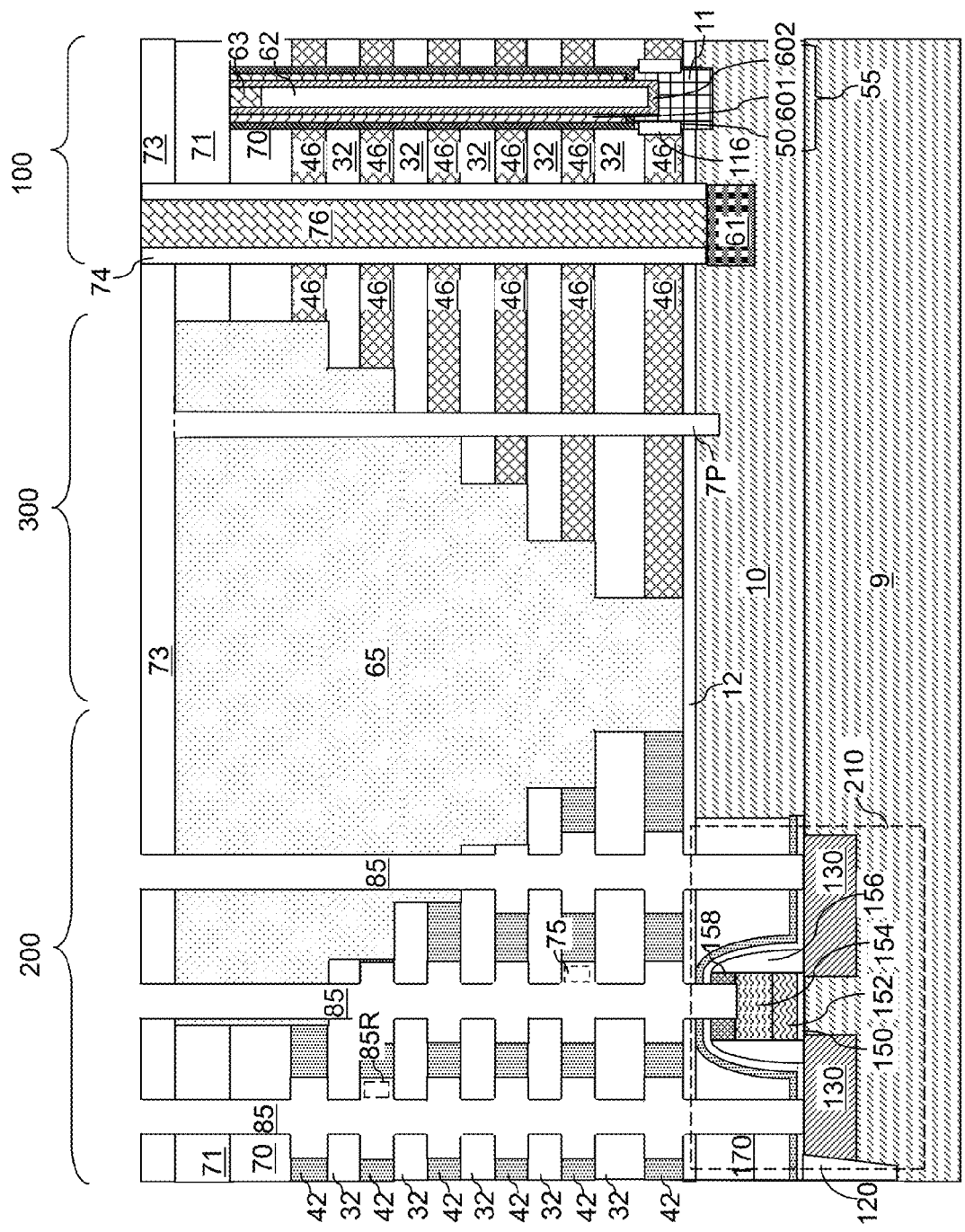
FIG. 18 is a vertical cross-sectional view of a third exemplary structure after lateral recessing of spacer material layers from peripheral via cavities according to a third embodiment of the present disclosure.

Referring to FIG. 18, a third exemplary structure according to a third embodiment of the present disclosure can be derived from the second exemplary structure illustrated in FIG. 14 by performing an isotropic etch on the spacer material layers (i.e., the sacrificial material layers 42) in the second alternating stack (32, 42) through the cavities 85. Lateral recesses 85R are formed by laterally recessing the spacer material layers within the second alternating stack around each peripheral device contact via cavity 85 employing an etch process that removes the material of the spacer material layers selective to the material of the insulating layers 32. For example, an etchant that etches the material of the sacrificial material layers 42 selective to the materials of the insulating layers 32 and the retro-stepped dielectric material portion 65 can be introduced into each of the peripheral device contact via cavities 85. The etchant can laterally recess the sacrificial material layers 42 relative to the sidewalls of the insulating layers 32 around each peripheral device contact via cavity 85 to form the lateral recesses 85R. In an illustrative example, the insulating layers 32 can include silicon oxide, the sacrificial material layers 42 can include silicon nitride, and the etchant can include hot phosphoric acid.

Figure 19:
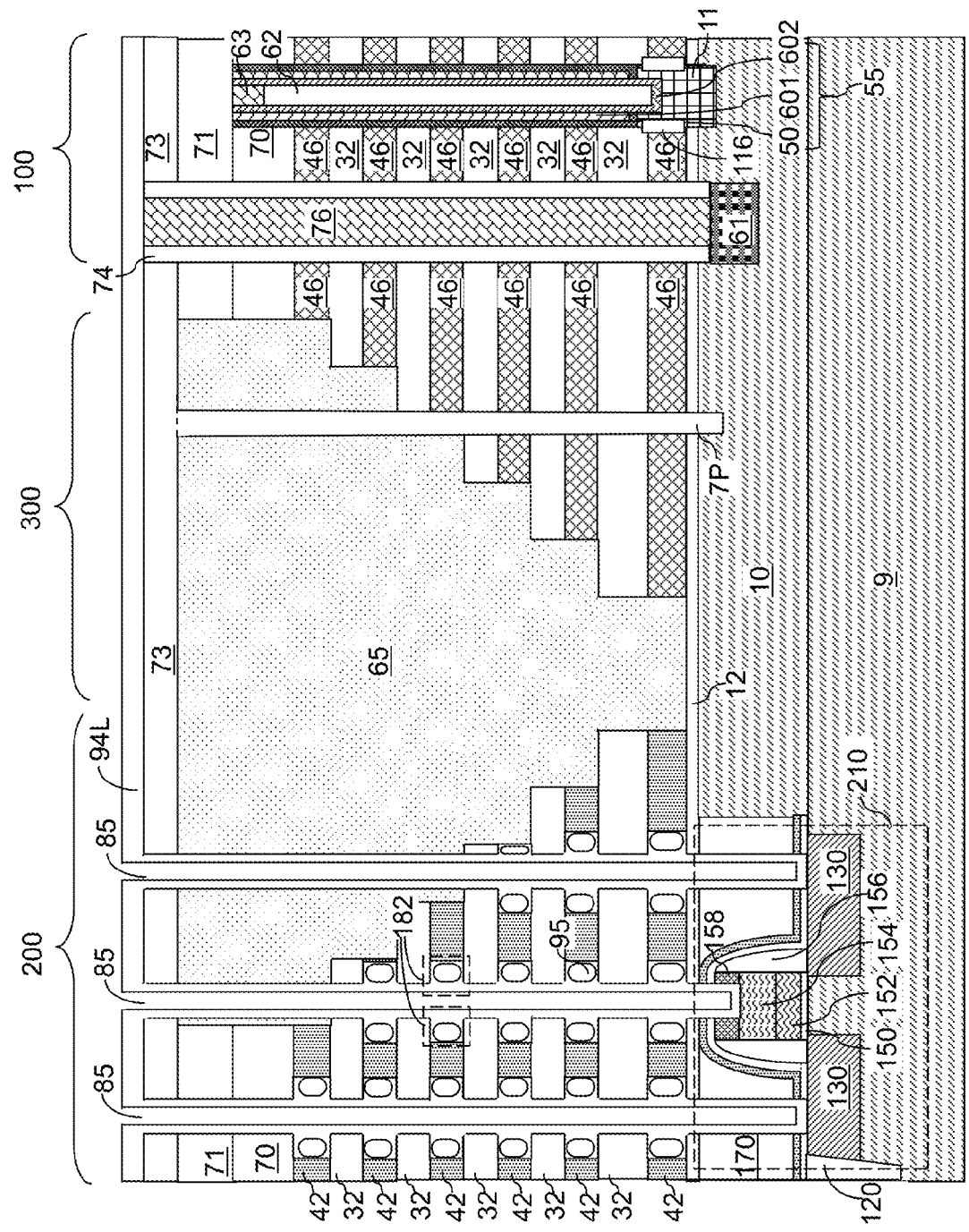
FIG. 19 is a vertical cross-sectional view of the third exemplary structure after formation of a non-conformal dielectric material layer according to the third embodiment of the present disclosure.

Referring to FIG. 19, a non-conformal dielectric material layer 94L can be deposited on each of the lateral recesses 85R and the peripheral contact via cavities 85. The non-conformal dielectric material layer 94L can include a material having a dielectric constant less than the dielectric constant of the material of the sacrificial material layers 42. For example, the sacrificial material layers 42 can include silicon nitride, and the non-conformal dielectric material layers 94L can include silicon oxide or organosilicate glass. The non-conformal dielectric material layer 94L can be formed by a plasma-enhanced chemical vapor deposition (PECVD). Such a deposition process is depletive, and the thickness of the deposited dielectric material is less within the lateral recesses 85R around the vertical portion of each peripheral device contact via cavity 85. Circumferential spacers 182 can be formed at each level of the spacer material layers (i.e., the sacrificial material layers 42) with a toroidal shape. For some circumferential spacers 182, a cavity 95 may be present within each respective toroidal shape. In one embodiment, each of at least two of the circumferential spacers 182 around a same peripheral contact via cavity 85 can have a toroidal shape with a respective cavity therein. Layers 94L may be 8 to 15 nm thick, while the cavity 95 may have a width of greater than 10 nm, such as 15-25 nm.

Figure 20:
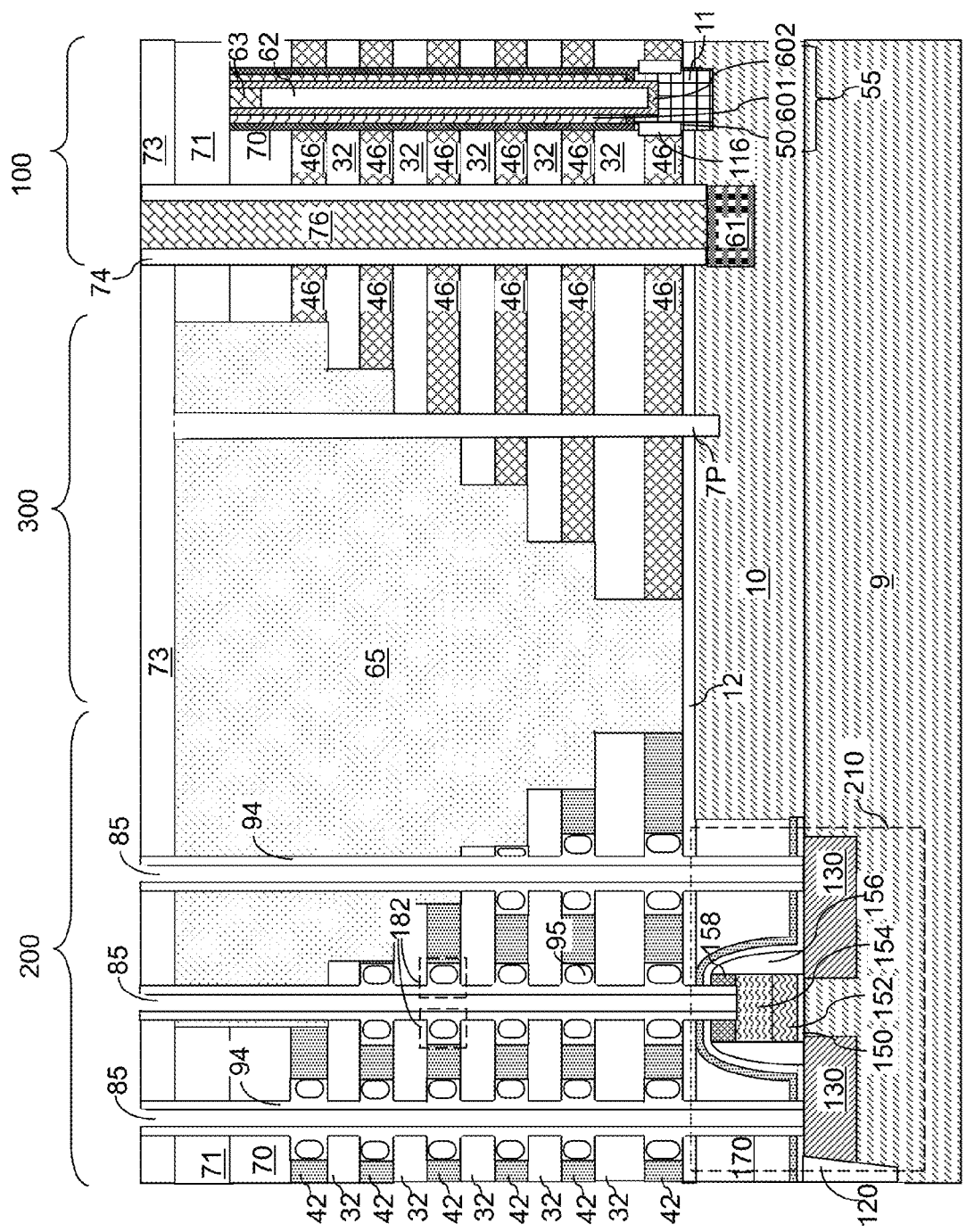
FIG. 20 is a vertical cross-sectional view of the third exemplary structure after an anisotropic etch that removes horizontal portions of the non-conformal dielectric material layer according to the third embodiment of the present disclosure.

Referring to FIG. 20, an anisotropic etch process can be performed to remove horizontal portions of the non-conformal dielectric material layer 94L. A dielectric liner 94 is formed around each peripheral device via cavity 85 to expose the nodes (e.g., source or drain regions 130 or gate electrodes 154) of the peripheral devices 210 at the bottom of the cavities 85. At least one of the dielectric liners 94 can include a plurality of circumferential spacers 182 located at respective levels of the spacer material layers (i.e., the sacrificial material layers 42) in the second alternating stack in the peripheral device region 200. Each circumferential spacer 182 is a remaining portion of the non-conformal dielectric material layer 94L that is located within respective lateral recesses 85R.

Figure 21:
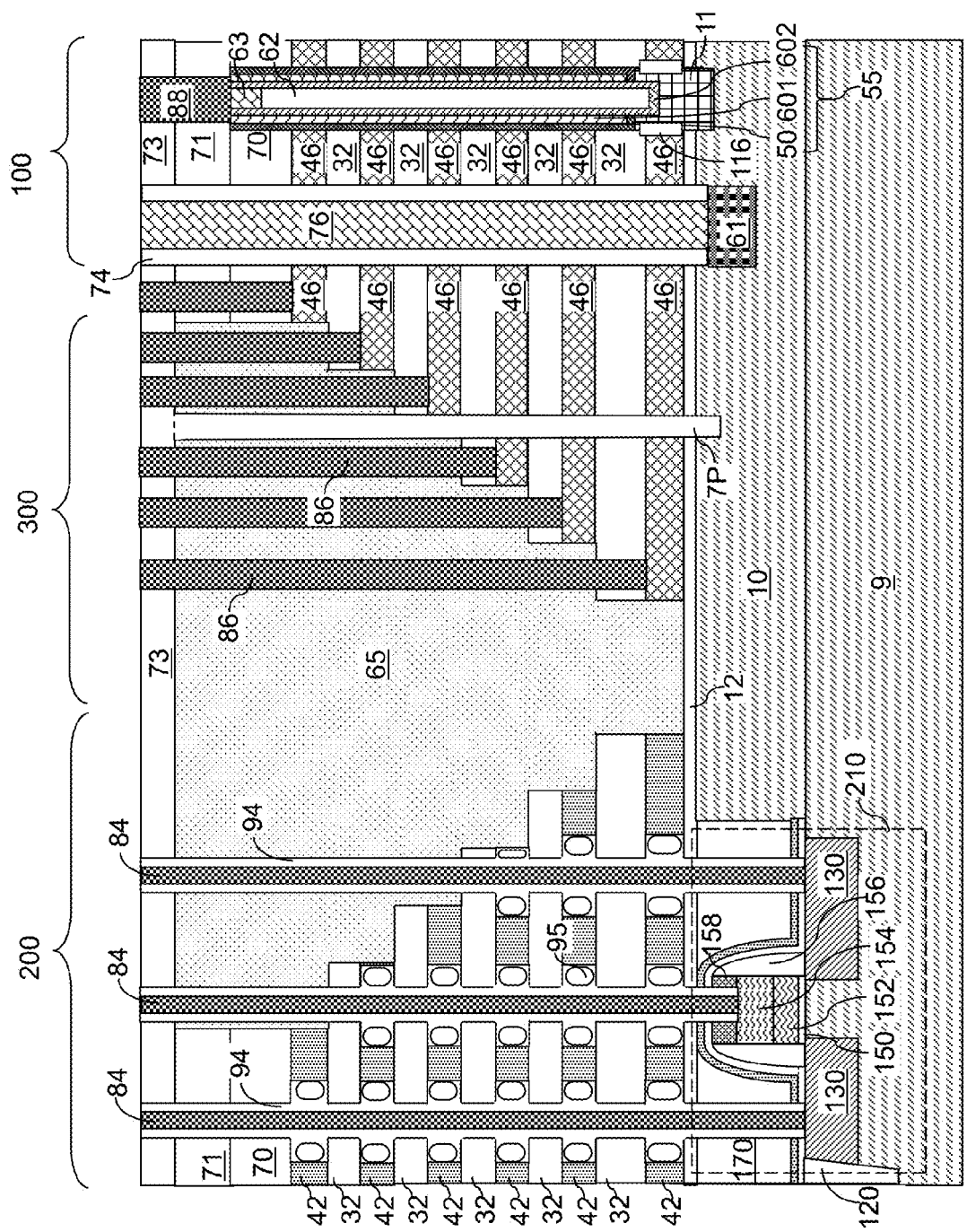
FIG. 21 is a vertical cross-sectional view of the third alternate embodiment of the third exemplary structure after formation of contact via structures according to the third embodiment of the present disclosure.

Referring to FIG. 21, the processing steps of FIGS. 16 and 17 can be performed to form additional contact via cavities, and to form contact via structures by filling the contact via cavities. At least one conductive material is deposited in the various via cavities (85, 87, 89) to form contact via structures (84, 86, 88). Excess portions of the at least one conductive material can be removed from above the top surface of the at least one contact level dielectric layer (71, 73) by a planarization process. The contact via structures (84, 86, 88) can include peripheral device contact via structures 84 that are formed in the peripheral device region 200 and contact nodes of peripheral devices, word line contact via structures 86 that contact respective electrically conductive layers that function as word lines, and drain contact via structures 88 that contact respective drain regions 63 overlying the memory stack structures 50. The peripheral device contact via structures 84 contact various nodes of the peripheral devices, and can be formed directly on sidewalls of the circumferential spacers 182, which are portions of the dielectric liners 94. In some embodiments, at least one of the peripheral device contact via structures 84 can pass through the retro-stepped dielectric material layer 65. In one embodiment, at least one of the circumferential spacers 182 has a toroidal shape with a cavity 95 therein as illustrated in FIG. 21. In one embodiment, the circumferential spacers 182 comprise a dielectric material selected from silicon oxide and organosilicate glass, which can be deposited by an anisotropic chemical vapor deposition process.

According to various embodiments of the present disclosure, a structure is provided, which includes a first alternating stack of first insulating layers 32 and electrically conductive layers 46 located over a substrate (9, 10) within the device region 100 and the contact region 300. The structure further includes a second alternating stack of second insulating layers 32 and spacer material layers 42 located over the substrate (9, 10) and laterally spaced from the first alternating stack. The first and second insulating layers 32 comprise a first dielectric material (such as silicon oxide), and the spacer material layers 42 comprise a second dielectric material (such as silicon nitride) having a greater dielectric constant than the first dielectric material. The structure further comprises at least one memory stack structure 55 vertically extending through the first alternating stack. Each of the at least one memory stack structure 55 comprises charge storage regions (as embodied as portions of the charge storage layer 504 at levels of the electrically conductive layers 46), a tunneling dielectric 506, and a semiconductor channel 60. The structure comprises a contact via structure (i.e., a peripheral device contact structure 84) vertically extending through the second alternating stack and contacting a device on or in the substrate (which can be a semiconductor device such as peripheral devices 210 for the memory stack structures 55).

In one embodiment, the contact via structure 84 can contact sidewalls of the second insulating layers 32, which are the insulating layers 32 in the peripheral device region 200. In one embodiment, the contact via structure 84 can contact sidewalls of the spacer material layers 42 as illustrated in FIG. 13.

In one embodiment, sidewalls of the spacer material layers 42 are laterally spaced from sidewalls of the contact via structure (85, 185) as illustrated in FIGS. 17 and 21. The contact via structure 84 may contact sidewalls of the insulating layers 32, and sidewalls of the spacer material layers 42 are laterally spaced from sidewalls of the contact via structure 84 as illustrated in FIG. 17.

In one embodiment, the structure can include circumferential spacers (82 or 182) located at levels of at least two of the spacer material layers 42, comprising a dielectric material having a lesser dielectric constant than the spacer material layers, and laterally surrounding the contact via structure 84. In one embodiment, the contact via structure 84 contacts sidewalls of circumferential spacers (82, 182). In one embodiment, at least one of the circumferential spacers (82) has a toroidal shape without any cavity therein as illustrated in FIG. 17. In another embodiment, at least one of the circumferential spacers (182) has a cavity 95 enclosed therein as illustrated in FIG. 21.

In one embodiment, the structure further comprises a retro-stepped dielectric material portion 65 that overlies first stepped surfaces of the first alternating stack and second stepped surfaces of the second alternating stack. In one embodiment, the contact via structure 84 extends through the retro-stepped dielectric material portion 65.

In one embodiment, the structure includes a three-dimensional memory device that comprises a vertical NAND device formed in a device region 100. The electrically conductive layers 46 comprise, or are electrically connected to, a respective word line of the NAND device. The device region 100 comprises a plurality of semiconductor channels 60. At least one end portion of each of the plurality of semiconductor channels 60 extends substantially perpendicular to a top surface of the substrate (9, 10). The structure includes a plurality of charge storage regions. Each charge storage region located adjacent to a respective one of the plurality of semiconductor channels 60. The structure includes a plurality of control gate electrodes (as embodied as end portions of the electrically conductive layers 46) having a strip shape extending substantially parallel to the top surface of the substrate (9, 10). The plurality of control gate electrodes comprises at least a first control gate electrode located in a first device level and a second control gate electrode located in a second device level. The electrically conductive layers 46 in the first alternating stack are in electrical contact with the plurality of control gate electrodes and extend from the device region 100 to a contact region 300 including a plurality of electrically conductive via connections (as embodied as word line contact via structures 86). In one embodiment, the substrate comprises a silicon substrate containing a driver circuit for the NAND device. The driver circuit devices 210 may be located under the second dummy dielectric layer stack (32, 42) in the peripheral region 200.

According to an aspect of the present disclosure, removal of the alternating stack (32, 42) from the peripheral device region 200 can be avoided, thereby reducing the number of processing steps and costs. Instead, peripheral device contact via cavities are formed through a remaining portion of the alternating stack, i.e., the second alternating stack. This method enables use of smaller stair region opening 64 relative to prior art methods, and thus, allows an easier gap fill and planarization process of dielectric 65 in addition to better critical dimension control on the leading stair edges. Also, this approach can provide give design flexibility for placement of contact via structures especially for a periphery-under-array scheme.

In an embodiment, RC coupling between the adjacent contacts via structures 84 in the peripheral device region 200 may be reduced by formation of circumferential spacers (82, 182) that have a lower dielectric constant than the spacer material layers 42.

In some embodiment, an air gap (i.e., a cavity 95) can be provided in a circumferential spacer 182. For example, for a 10 nm thick liner 94, the overall capacitance between neighboring contact via structures 84 should be equal to, or less than, the overall capacitance for conventional contact via structures formed entirely within a silicon oxide material portion when the air gap 95 width is greater than 10 nm.

In an illustrative example, the methods of the present disclosure can provide contact via structures 84 directly through ON tier stack (i.e., an alternating stack of silicon oxide layers and silicon nitride layers) with matched or reduced RC coupling between neighboring contact via structures compared with conventional methods employing replacement of the portion of the ON tier stack in region 200 with silicon oxide 65. The methods of the present disclosure can provide contact via structures through ON tier stack in a manner that improves process margin and reduces cost, and provides design flexibility for periphery-under-array scheme.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A structure comprising:
   a first alternating stack of first insulating layers and electrically conductive layers located over a substrate;
   a second alternating stack of second insulating layers and spacer material layers located over the substrate and laterally spaced from the first alternating stack, wherein the first and second insulating layers comprise a first dielectric material, and the spacer material layers comprise a second dielectric material different than the first dielectric material and not physically contacting any of the electrically conductive layers, and wherein each of the first insulating layers is located at a same level as a respective one of the second insulating layers and each of the electrically conductive layers is located at a same level as a respective one of the spacer material layers;
   at least one memory stack structure vertically extending through the first alternating stack, each of the at least one memory stack structure comprising charge storage regions, a tunneling dielectric, and a semiconductor channel; and
   a contact via structure vertically extending through the second alternating stack and contacting a device on or in the substrate.

2. The structure of claim 1, wherein the contact via structure contacts sidewalls of the second insulating layers.

3. The structure of claim 2, wherein the contact via structure contacts sidewalls of the spacer material layers.

4. The structure of claim 2, wherein sidewalls of the spacer material layers are laterally spaced from sidewalls of the contact via structure, and wherein the second dielectric material has a greater dielectric constant than the first dielectric material.

5. The structure of claim 4, further comprising circumferential spacers located at levels of at least two of the spacer material layers, comprising a dielectric material having a lesser dielectric constant than the spacer material layers, and laterally enclosing the contact via structure.

6. The structure of claim 5, wherein the contact via structure contacts sidewalls of circumferential spacers.

7. The structure of claim 6, wherein the structure comprises at least one feature selected from:
   a first feature that at least one of the circumferential spacers have a toroidal shape without any cavity therein;
   a second feature that at least one of the circumferential spacers has a toroidal shape with a cavity therein; and
   a third feature that the spacer material layers comprise silicon nitride, and the circumferential spacers comprise a material selected from silicon oxide or silicon oxynitride.

8. The structure of claim 1, wherein:
   the device comprises a peripheral device of a memory device array located in the first alternating stack; and
   the device is located under the second alternating stack.

9. The structure of claim 1, further comprising a retro-stepped dielectric material portion that overlies first stepped surfaces of the first alternating stack and second stepped surfaces of the second alternating stack, wherein each of the spacer material layer is laterally spaced from each of the electrically conductive layers by the retro-stepped dielectric material portion.

10. The structure of claim 9, wherein the contact via structure extends through the retro-stepped dielectric material portion.

11. The structure of claim 9, wherein:
the structure comprises a three-dimensional memory device that comprises a vertical NAND device formed in a device region;
the electrically conductive layers comprise, or are electrically connected to, a respective word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the first alternating stack are in electrical contact with the plurality of control gate electrodes and extend from the device region to a contact region including a plurality of electrically conductive via connections; and
the substrate comprises a silicon substrate containing a driver circuit for the NAND device.

12. The structure of claim 1, wherein:
the first alternating stack of first insulating layers and electrically conductive layers comprises multiple repetitions of a first unit layer stack that includes a first insulating layer and an electrically conductive layer; and
the second alternating stack of second insulating layers and spacer material layers comprises multiple repetitions of a second unit layer stack that includes a second insulating layer and a spacer material layer.

13. A structure comprising:
a first alternating stack of multiple repetitions of a first unit layer stack that includes a first insulating layer and an electrically conductive layer located over a substrate;
a second alternating stack of multiple repetitions of a second unit layer stack that includes a second insulating layer and a spacer material layer located over the substrate and laterally spaced from the first alternating stack, wherein the first and second insulating layers comprise a first dielectric material, and the spacer material layers comprise a second dielectric material different than the first dielectric material and not physically contacting any instance of the electrically conductive layer;
at least one memory stack structure vertically extending through the first alternating stack, each of the at least one memory stack structure comprising charge storage regions, a tunneling dielectric, and a semiconductor channel; and
a contact via structure vertically extending through the second alternating stack and contacting a device on or in the substrate.

14. The structure of claim 13, wherein the contact via structure contacts sidewalls of the second insulating layers.

15. The structure of claim 14, wherein the contact via structure contacts sidewalls of the spacer material layers.

16. The structure of claim 14, wherein sidewalls of the spacer material layers are laterally spaced from sidewalls of the contact via structure, and wherein the second dielectric material has a greater dielectric constant than the first dielectric material.

17. The structure of claim 16, further comprising circumferential spacers located at levels of at least two of the spacer material layers, comprising a dielectric material having a lesser dielectric constant than the spacer material layers, and laterally enclosing the contact via structure, wherein the contact via structure contacts sidewalls of circumferential spacers.

18. The structure of claim 17, wherein the structure comprises at least one feature selected from:
a first feature that at least one of the circumferential spacers have a toroidal shape without any cavity therein;
a second feature that at least one of the circumferential spacers has a toroidal shape with a cavity therein; and
a third feature that the spacer material layers comprise silicon nitride, and the circumferential spacers comprise a material selected from silicon oxide or silicon oxynitride.

19. The structure of claim 13, wherein:
the device comprises a peripheral device of a memory device array located in the first alternating stack; and
the device is located under the second alternating stack.

20. The structure of claim 13, further comprising a retro-stepped dielectric material portion that overlies first stepped surfaces of the first alternating stack and second stepped surfaces of the second alternating stack, wherein each of the spacer material layer is laterally spaced from each of the electrically conductive layers by the retro-stepped dielectric material portion.

21. The structure of claim 20, wherein the contact via structure extends through the retro-stepped dielectric material portion.

22. The structure of claim 20, wherein:
the structure comprises a three-dimensional memory device that comprises a vertical NAND device formed in a device region;
the electrically conductive layers comprise, or are electrically connected to, a respective word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the first alternating stack are in electrical contact with the plurality of control gate electrodes and extend from the device region to a contact region including a plurality of electrically conductive via connections; and
the substrate comprises a silicon substrate containing a driver circuit for the NAND device.

23. The structure of claim 13, wherein each of the first insulating layers is located at a same level as a respective one of the second insulating layers and each of the electrically conductive layers is located at a same level as a respective one of the spacer material layers.

\* \* \* \* \*